(12) United States Patent
Sun et al.

(10) Patent No.: US 11,832,389 B2
(45) Date of Patent: Nov. 28, 2023

(54) PRINTED CIRCUIT MODULE AND ELECTRONIC DEVICE INCLUDING THE SAME

(71) Applicant: SAMSUNG ELECTRONICS CO., LTD., Suwon-si (KR)

(72) Inventors: Taewon Sun, Suwon-si (KR); Jichul Kim, Suwon-si (KR); Kicheol Bae, Suwon-si (KR); Jinyong Park, Suwon-si (KR); Jungje Bang, Suwon-si (KR); Yongjae Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 198 days.

(21) Appl. No.: 17/431,900

(22) PCT Filed: Aug. 13, 2021

(86) PCT No.: PCT/KR2021/010807
§ 371 (c)(1),
(2) Date: Aug. 18, 2021

(87) PCT Pub. No.: WO2022/039453
PCT Pub. Date: Feb. 24, 2022

(65) Prior Publication Data
US 2022/0361334 A1 Nov. 10, 2022

(30) Foreign Application Priority Data
Aug. 18, 2020 (KR) .................... 10-2020-0103170

(51) Int. Cl.
*H05K 1/18* (2006.01)
*H05K 1/14* (2006.01)
(Continued)

(52) U.S. Cl.
CPC ............ *H05K 1/14* (2013.01); *H04M 1/0249* (2013.01); *H05K 1/0216* (2013.01); *H05K 1/181* (2013.01);
(Continued)

(58) Field of Classification Search
CPC ........ H05K 1/14; H05K 1/0216; H05K 1/181; H05K 7/1427; H05K 2201/10378; H04M 1/0249
(Continued)

(56) References Cited

U.S. PATENT DOCUMENTS

2001/0046129 A1 11/2001 Broglia et al.
2012/0212917 A1 8/2012 Shin et al.
(Continued)

FOREIGN PATENT DOCUMENTS

JP 2001-111232 4/2001
KR 10-2012-0096754 8/2012
(Continued)

OTHER PUBLICATIONS

Search Report and Written Opinion dated Nov. 30, 2021 in counterpart International Patent Application No. PCT/KR2021/010807.

*Primary Examiner* — Binh B Tran
(74) *Attorney, Agent, or Firm* — Nixon & Vanderhye P.C.

(57) ABSTRACT

An electronic device according to various embodiments may include: a display, a first circuit board disposed under the display, a first component and a second component disposed on one surface of the first circuit board, the first and second components each having different heights, a first interposer surrounding at least one side surface of the first component and disposed in a first region of the first circuit board, the first interposer part having a first height, a second interposer part surrounding at least one side surface of the second component and disposed in a second region of the first (Continued)

circuit board, the second interposer part having a second height different from the first height, a first second circuit board, at least a portion of which is spaced apart from the first region of the first circuit board, the first second circuit board including a first first portion bonded to the first interposer part, and a second second circuit board, at least a portion of which is spaced apart from the second region of the first circuit board, the second second circuit board including a first second portion bonded to the second interposer and spaced apart from the first second circuit board by a specified gap.

19 Claims, 12 Drawing Sheets

(51) Int. Cl.
    *H04M 1/02* (2006.01)
    *H05K 1/02* (2006.01)
    *H05K 7/14* (2006.01)
(52) U.S. Cl.
    CPC . *H05K 7/1427* (2013.01); *H05K 2201/10378* (2013.01)

(58) Field of Classification Search
    USPC .......................................................... 361/748
    See application file for complete search history.

(56) References Cited

U.S. PATENT DOCUMENTS

| | | |
|---|---|---|
| 2013/0200511 A1 | 8/2013 | Banijamali |
| 2013/0201648 A1* | 8/2013 | Cheng .................... H05K 1/144 361/803 |
| 2016/0216445 A1 | 7/2016 | Thacker et al. |
| 2017/0125359 A1* | 5/2017 | Sakai .................... H01L 25/117 |
| 2020/0344869 A1 | 10/2020 | So et al. |
| 2021/0014970 A1* | 1/2021 | Ha ......................... H05K 1/144 |
| 2021/0251079 A1 | 8/2021 | Park et al. |

FOREIGN PATENT DOCUMENTS

| | | |
|---|---|---|
| KR | 10-2014-0111716 | 4/2014 |
| KR | 10-2017-0117396 | 10/2017 |
| KR | 10-2019-0123939 | 11/2019 |
| KR | 10-2020-0126124 | 11/2020 |
| KR | 10-2021-0007217 | 1/2021 |
| KR | 10-2021-0101671 | 8/2021 |

* cited by examiner

PRINTED CIRCUIT MODULE AND ELECTRONIC DEVICE INCLUDING THE SAME

CROSS-REFERENCE TO RELATED APPLICATIONS

This application is a national stage of International Application No. PCT/KR2021/010807 designating the United States, filed on Aug. 13, 2021, in the Korean Intellectual Property Receiving Office and claiming priority to Korean Patent Application No. 10-2020-0103170, filed on Aug. 18, 2020, in the Korean Intellectual Property Office, the disclosures of which are incorporated by reference herein in their entireties.

BACKGROUND

Field

The disclosure relates to a circuit board module and an electronic device including the circuit board module.

Description of Related Art

Due to the remarkable development of information communication technology and semiconductor technology, the distribution and use of various electronic devices are rapidly increasing. In particular, recent electronic devices are being developed such that users are capable of communicating with each other while carrying the electronic devices.

Typically, an electronic device may refer to a device that performs a specific function according to a program provided therein (e.g., an electronic scheduler, a portable multimedia reproducer, a mobile communication terminal, a tablet PC, an image/sound device, a desktop/laptop PC, or a vehicle navigation system), as well as a home appliance. The above-mentioned electronic devices may output, for example, information stored therein and/or transmitted thereto as sound or an image. As the degree of integration of electronic devices has increased and super-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproducing function), a communication and security function (e.g., mobile banking), a schedule management function, and an e-wallet function, are integrated in a single electronic device, in addition to a communication function. Such an electronic device has been miniaturized so that the user can conveniently carry the electronic device.

A printed circuit board disposed in an electronic device may be manufactured as a multilayer printed circuit board (e.g., a circuit board module) for mounting efficiency. Circuit boards disposed in a multilayer printed circuit board may be designed to have sizes corresponding to each other and to be arranged side by side. In such a structure, many empty spaces may exist according to various thicknesses of components mounted therein and may limit the miniaturization of the circuit board module and/or an electronic device. In addition, an interposer disposed in a multilayer printed circuit board may be designed in a closed loop shape depending on the shape of the electronic device/printed circuit board. Such an interposer may be vulnerable to bending (e.g., warpage or ball open) and/or cracking due to a high temperature occurring during a process because the interposer is not standardized in shape, has many inflection points, and has a large size.

SUMMARY

Embodiments of the disclosure provide separate interposers having different heights and circuit boards corresponding to the interposers may be implemented. Accordingly, by appropriately arranging components having various thicknesses, it is possible to efficiently utilize a mounting space in a circuit board module.

Embodiments of the disclosure provide a plurality of discontinuous and separated interposers, thereby improving electrical connection between stacked printed circuit boards, and bending (e.g., warpage), lifting, and/or cracking, which have occurred in one closed loop shape) can be reduced.

An electronic device according to an example embodiment may include: a display, a first circuit board disposed under the display, a first component and a second component disposed on one surface of the first circuit board, the first and second components each having different heights, a first interposer part surrounding at least one side surface of the first component and disposed in a first region of the first circuit board, the first interposer part having a first height, a second interposer partsurrounding at least one side surface of the second component and disposed in a second region of the first circuit board, the second interposer part having a second height different from the first height, a first second circuit board, at least a portion of which is disposed to be spaced apart from the first region of the first circuit board, the first second circuit board including a first first portion bonded to the first interposer part, and a second second circuit board, at least a portion of which is disposed to be spaced apart from the second region of the first circuit board, the second second circuit board including a first second portion bonded to the second interposer part and being spaced apart from the first second circuit board by a specified gap.

An electronic device according to an example embodiment may include: a display, a first circuit board disposed under the display, a first component and a second component disposed on one surface of the first circuit board, the first and second components each having different heights, a first second circuit board, at least a portion of which is disposed parallel with a first region of the first circuit board, a second second circuit board, at least a portion of which is disposed parallel with a second region of the first circuit board, a first interposer part disposed between the first region of the first circuit board and the first second circuit board, the first interposer partsurrounding at least two side surfaces of the first component and having a first height, and a second interposer part disposed between the second region of the first circuit board and the second second circuit board, the second interposer surrounding at least two side surfaces of the second component and having a second height different from the first height, wherein a first portion of the first second circuit board facing the second second circuit board may overlap at least a portion of a second portion of the second second circuit board facing the first second circuit board.

An electronic device according to an example embodiment may include: a display, a first circuit board disposed under the display, a second circuit board disposed parallel with the first circuit board between the display and the first circuit board, a first component and a second component disposed on the first circuit board, the first and second components each having different heights, a first third circuit board disposed between the first region of the first circuit board and the second circuit board and spaced apart from the first region by a first distance, a second third circuit board disposed between the second region of the first circuit board and the second circuit board and spaced apart from the second region by a second distance different from the first distance, a first interposer part surrounding at least one side surface of the first component and coupled between the first region of the first circuit board and the first third circuit board, a second interposer part surrounding at least one side surface of the second component and coupled between the second region of the first circuit board and the second third circuit board, a third interposer coupled between the first third circuit board and a third region of the second circuit board, and a fourth interposer coupled between the second third circuit board and a fourth region of the second circuit board.

An electronic device according to various example embodiments of the disclosure may provide a circuit board module including a plurality of divided interposers.

According to various example embodiments of the disclosure, since the arrangement of a plurality of discontinuously separated interposers and corresponding circuit boards is diversified, it is possible to efficiently arrange components having various thicknesses and to implement a multi-surface mounting structure having at least three surfaces.

According to various example embodiments of the disclosure, by overlapping and connecting structures of circuit boards having different heights, it is possible to minimize and/or reduce bending (e.g., warpage) of circuit boards occurring in a process, to improve shielding performance, and to reduce wiring loss between components.

The effects obtainable by this disclosure are not limited to those described above, and other effects, which are not described above, can be clearly understood by a person ordinarily skilled in the technical field, to which this disclosure belongs.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
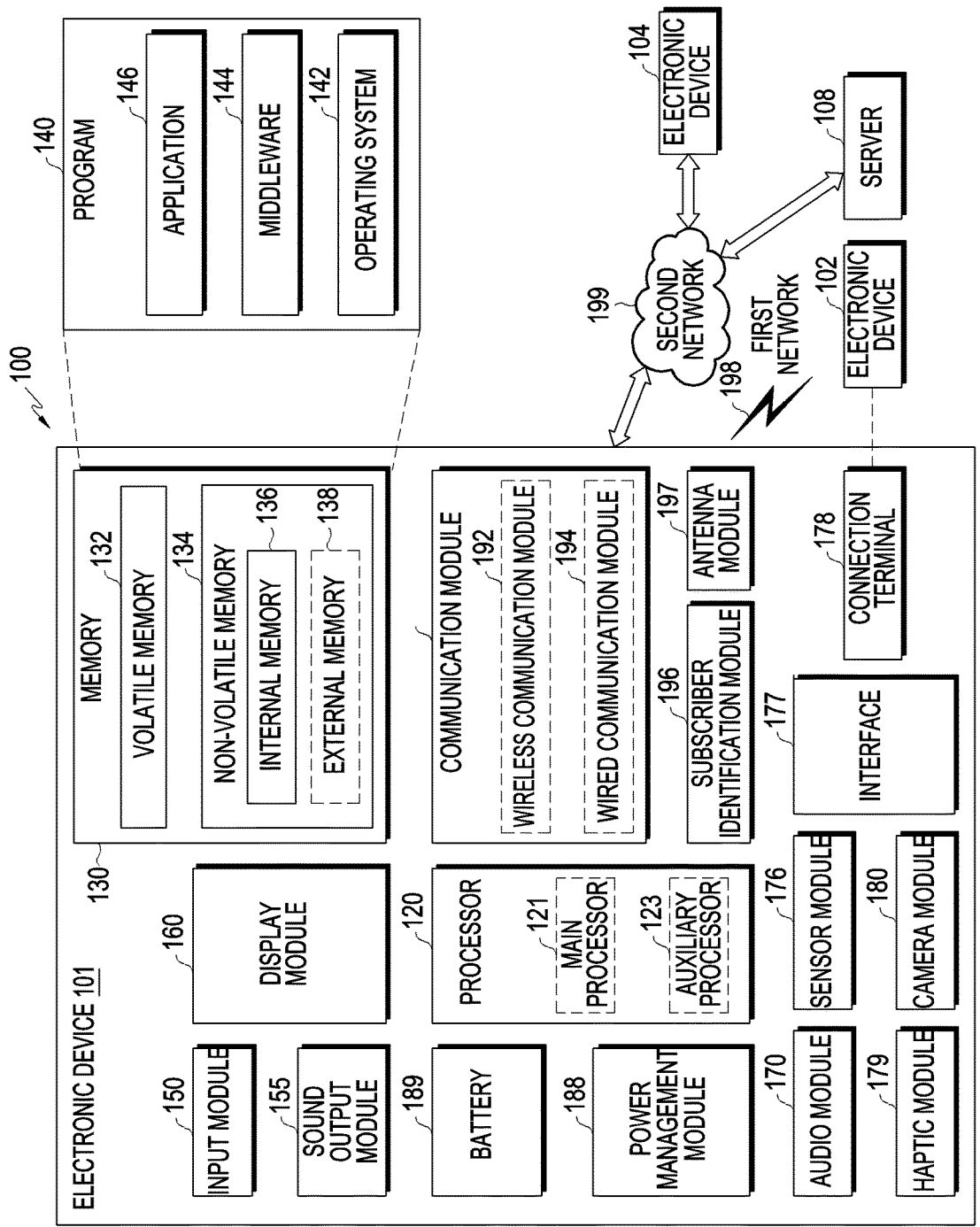
FIG. 1 is a block diagram illustrating an example electronic device in a network environment according to various embodiments.

FIG. 1 is a block diagram illustrating an example electronic device in a network environment according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101.

The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and/or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
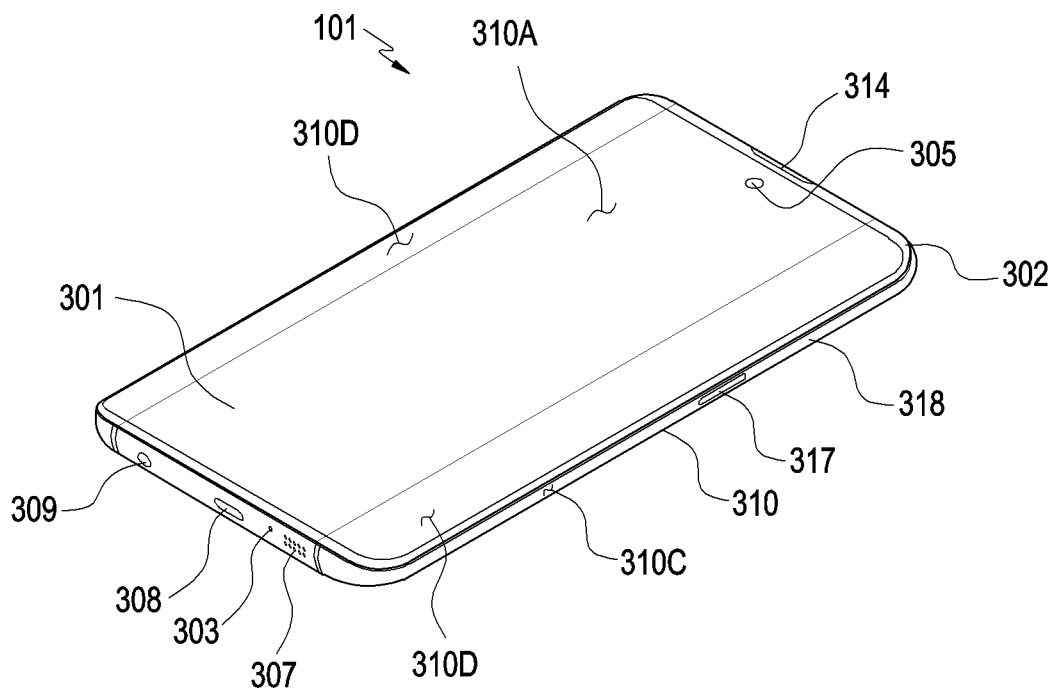
FIG. 2 is a front perspective view illustrating an electronic device according to various embodiments.
Figure 3:
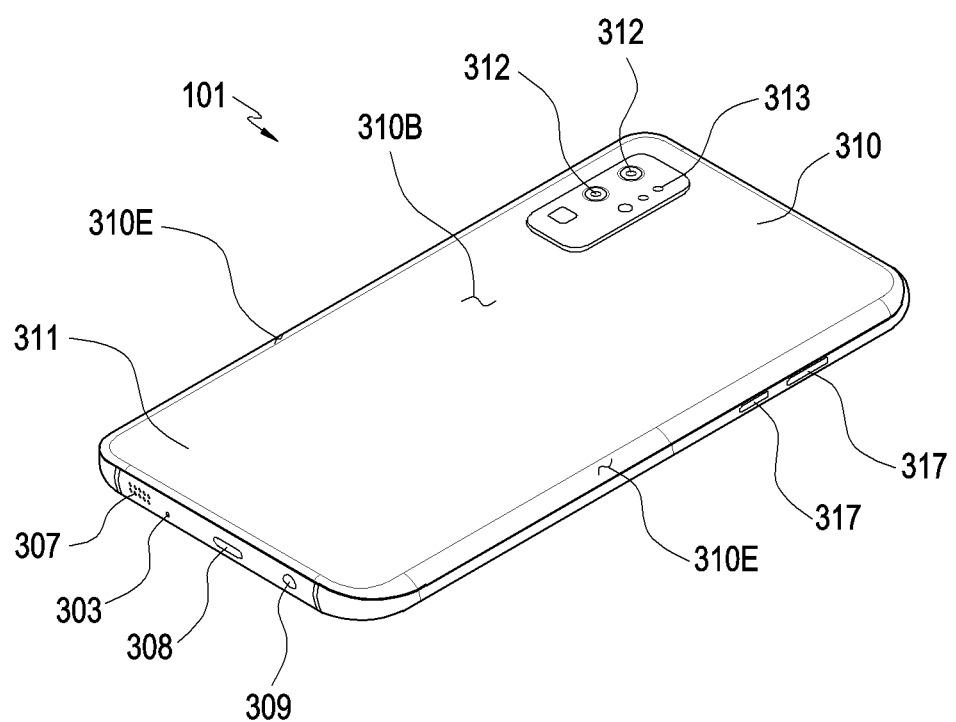
FIG. 3 is a rear perspective view illustrating the electronic device according to various embodiments.

FIG. 2 is a front perspective view illustrating an electronic device according to various embodiments. FIG. 3 is a rear perspective view illustrating the electronic device according to various embodiments.

Referring to FIGS. 2 and 3, an electronic device 101 according to an embodiment may include a housing 310 including a front surface 310A, a rear surface 310B, and a side surface 310C surrounding a space between the front surface 310A and the rear surface 310B. In an embodiment (not illustrated), the term "housing 310" may refer to a structure forming a part of the front surface 310A, the rear surface 310B, and the side surface 310C in FIG. 2. According an embodiment, at least a portion of the front surface 310A may be defined by a substantially transparent front plate 302 (e.g., a glass plate or a polymer plate including various coating layers). The rear surface 310B may be defined by a rear plate 311. The rear plate 311 may be made of, for example, glass, ceramic, a polymer, a metal (e.g., aluminum, stainless steel (STS), or magnesium), or a combination of two or more of these materials. The side surface 310C may be defined by a side bezel structure (or a "side member") 318 coupled to the front plate 302 and the rear plate 311 and including a metal and/or a polymer. In various embodiments, the rear plate 311 and the side bezel structure 318 may be integrally configured, and may include the same material (e.g., a ceramic or metal material such as glass or aluminum).

In the illustrated embodiment, the front plate 302 may include, at the long opposite side edges thereof, two first edge regions 310D, which are bent from the first surface 310A toward the rear plate 311 and extend seamlessly. In the illustrated embodiment (see FIG. 3), the rear plate 311 may include, at the long opposite side edges thereof, two second edge regions 310E, which are bent from the rear surface 310B toward the front plate 302 and extend seamlessly. In various embodiments, the front plate 302 (or the rear plate 311) may include only one of the first edge regions 310D (or the second edge regions 310E). In an embodiment, some of the first edge regions 310D or the second edge regions 310E may not be included. In the embodiments described above, when viewed from a side of the electronic device 101, the side bezel structure 318 may have a first thickness (or width) on the side surface portions that do not include the first edge regions 310D or the second edge regions 310E described above, and may have a second thickness, which is smaller than the first thickness, on the side surface portions that include the first edge regions 310D or the second edge regions 310E.

According to an embodiment, the electronic device 101 may include at least one of a display device 301 (e.g., the display device 160 in FIG. 1), audio modules 303, 307, and 314 (e.g., the audio module 170 in FIG. 1), a sensor module (e.g., the sensor module 176 in FIG. 1), camera modules 305, 312, and 313 (e.g., the camera module 180 in FIG. 1), a key input device 317 (e.g., the input device 150 in FIG. 1), and connector holes 308 and 309 (e.g., the connection terminal 178 in FIG. 1). In various embodiments, in the electronic device 101, at least one of the components (e.g., the connector hole 309) may be omitted, or other components may be additionally included.

According to an embodiment, the display 301 may be visible through a substantial portion of, for example, the front plate 302. In various embodiments, at least a portion of the display 301 may be visible through the front plate 302 defining the front surface 310A and the first edge regions 310D. In various embodiments, the edges of the display 301 may be configured to be substantially the same as the shape of the periphery of the front plate 302 adjacent thereto. In an embodiment (not illustrated), the distance between the periphery of the display 301 and the periphery of the front plate 302 may be substantially constant in order to enlarge the exposed area of the display 301.

According to an embodiment, the surface (or the front plate 302) of the housing 310 may include a screen display region defined as the display 301 is visually exposed. For example, the screen display region may include the front surface 310A and the first edge regions 310D.

In an embodiment (not illustrated), a part of the screen display region (e.g., the front surface 310A and the first edge regions 310D) of the display 301 may define a recess or an opening and may include at least one of an audio module 314, a sensor module (not illustrated), and a light-emitting element (not illustrated), and a camera module 305, which are aligned with the recess or the opening. In an embodiment (not illustrated), the rear surface of the screen display region of the display 301 may include at least one of the audio module 314, the sensor module (not illustrated), the camera module 305, the fingerprint sensor (not illustrated), and the light-emitting element (not illustrated).

According to an embodiment, one or more camera modules 305 and 312 may be disposed under the display 301. For example, the first camera module 305 may be disposed on at least a partial region of the display 301 corresponding to a camera field of view (FOV). Since the first camera module 305 is disposed on at least a partial region of the display 301 corresponding to the camera field of view (FOV), the position of the first camera module 305 may not be visually distinguished (or exposed). According to an embodiment, when the display 301 is viewed from the first surface 310A, the first camera module 305 may be disposed in a portion corresponding to the camera field of view (FOV), which is at least a part of the display 301, and may acquire an image of an external subject without being visually exposed to the outside. For example, the first camera module 305 may be an under-display camera (UDC).

In an embodiment, the electronic device 101 may include a display (not illustrated), which is arranged to be slidable and provides a screen (e.g., a display region). For example, the display region of the electronic device 101 may be a region that is visually exposed and enables an image to be output. In an example, in the electronic device 101, the display region is adjustable according to the movement of the sliding plate (not illustrated) or the movement of the display. For example, the electronic device 101 may include a rollable type electronic device that is configured such that at least a part (e.g., the housing 310) of the electronic device 101 is at least partially slidably operated to achieve selective expansion of the display region. The above-described display may be referred to as, for example, a slide-out display or an expandable display.

In an embodiment (not illustrated), the display 301 may be coupled to or disposed adjacent to a touch-sensitive circuit, a pressure sensor capable of measuring a touch intensity (pressure), and/or a digitizer configured to detect a magnetic-field-type stylus pen. In various embodiments, at least some of the key input devices 317 may be disposed in the first edge regions 310D and/or the second edge regions 310E.

According to an embodiment, the audio modules 303, 307, and 314 may include a microphone hole 303 and speaker holes 307 and 314. The microphone hole 303 may include a microphone disposed therein to acquire external sound, and in various embodiments, a plurality of microphones may be disposed therein to be able to detect the direction of sound. The speaker holes 307 and 314 may include an external speaker hole 307 and a phone call receiver hole 314. In various embodiments, the speaker holes 307 and 314 and the microphone hole 303 may be implemented as a single hole, or a speaker (e.g., a piezo speaker) may be included without the speaker holes 307 and 314. The audio modules 303, 307, and 314 are not limited to the above-described structure, and may be variously changed in design depending on the structure of the electronic device 101, for example, by mounting only some of the audio modules or by adding new audio modules.

According to an embodiment, sensor modules (not illustrated) may generate an electrical signal or a data value corresponding to, for example, an internal operating state of the electronic device 101 or an external environmental state. The sensor modules (not illustrated) may include, for example, a first sensor module (e.g., a proximity sensor) and/or a second sensor module (e.g., a fingerprint sensor) disposed on the front surface 310A of the housing 310, and/or a third sensor module (e.g., an HRM sensor) and/or a fourth sensor module (e.g., a fingerprint sensor) disposed on the rear surface 310B of the housing 310. In various embodiments (not illustrated), the fingerprint sensor may be disposed not only on the front surface 310A (e.g., the display 301) of the housing 310, but also on the rear surface 310B. The electronic device 101 may further include at least one of sensor modules (not illustrated in the drawings), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure, and may be variously changed in design depending on the structure of the electronic device 101, for example, by mounting only some of the sensor modules or by adding new sensor modules.

According to an embodiment, the camera modules 305, 312, and 313 may include, for example, a front camera module 305 disposed on the front surface 310A of the electronic device 101, a rear camera module 312 disposed on the rear surface 310B, and/or a flash 313. The camera modules 305 and 312 may include one or more lenses, an image sensor, and/or an image signal processor. The flash 313 may include, for example, a light-emitting diode or a xenon lamp. In various embodiments, two or more lenses (e.g., an infrared camera, a wide-angle lens, and a telephoto lens), and image sensors may be disposed on one surface of the electronic device 101. The camera modules 305, 312, and 313 are not limited to the above-described structure, and may be variously changed in design depending on the structure of the electronic device 101, for example, by mounting only some of the camera modules or by adding new camera modules.

According to an embodiment, the electronic device 101 may include a plurality of camera modules (e.g., a dual camera or a triple camera) having different properties (e.g., angles of view) or functions, respectively. For example, a plurality of camera modules 305 and 312 including lenses having different angles of view may be configured, and the electronic device 101 is capable of controlling the change of the angles of view of the camera modules 305 and 312 executed therein on the basis of a user's selection. For example, at least one of the plurality of camera modules 305 and 312 may be a wide-angle camera, and at least one of other camera modules may be a telephoto camera. Similarly, for example, at least one of the plurality of camera modules 305 and 312 may be a front camera, and at least one of other camera modules may be a rear camera. In addition, the plurality of camera modules 305 and 312 may include at least one of a wide-angle camera, a telephoto camera, or an infrared (IR) camera (e.g., a time-of-flight (TOF) camera, or a structured light camera). According to an embodiment, the IR camera may be operated as at least part of a sensor module. For example, the TOF camera may be operated as at least a part of a sensor module (not illustrated) for detecting a distance to a subject.

According to an embodiment, the key input devices 317 may be disposed on the side surface 310C of the housing 310. In an embodiment, the electronic device 101 may not include some or all of the above-mentioned key input devices 317, and a key input device 317, which is not included in the above-mentioned key input devices, may be implemented in another type, such as a soft key, on the display 301. In various embodiments, a key input device may include a sensor module (not illustrated) disposed on the rear surface 310B of the housing 310.

According to an embodiment, light-emitting elements (not illustrated) may be disposed on, for example, the front surface 310A of the housing 310. The light-emitting elements (not illustrated) may provide, for example, information about the state of the electronic device 101 in an optical form. In an embodiment, the light-emitting elements (not illustrated) may provide a light source that is interlocked with, for example, the operation of the front camera module 305. The light-emitting elements (not illustrated) may include, for example, an LED, an IR LED, and/or a xenon lamp.

According to an embodiment, the connector holes 308 and 309 may include, for example, a first connector hole 308 capable of accommodating a connector (e.g., a USB connector) for transmitting/receiving power and/or data to/from an external electronic device, and/or a second connector hole 309 capable of accommodating a connector (e.g., an earphone jack) for transmitting/receiving an audio signal to/from an external electronic device.

According to an embodiment, some camera modules 305 of the camera modules 305 and 312 and/or some sensor modules (not illustrated) of the sensor modules may be disposed to be exposed to the outside through at least a portion of the display 301. For example, the camera modules 305 may include a punch hole camera disposed inside a hole or recess defined in the rear surface of the display 301. According to an embodiment, the camera modules 312 may be disposed inside the housing 310 such that the lens is exposed to the rear surface 310B of the electronic device 101. For example, the camera modules 312 may be disposed on a printed circuit board (e.g., the printed circuit board 340 in FIG. 4).

According to an embodiment, the camera modules 305 and/or the sensor modules may be disposed from the internal space of the electronic device 101 to the front plate 302 of the display 301 to come into contact with the external environment through a transparent region. In addition, some sensor modules (not illustrated) may be disposed in the internal space in the electronic device so as to implement the functions thereof without being visually exposed through the front plate 302.

Figure 4:
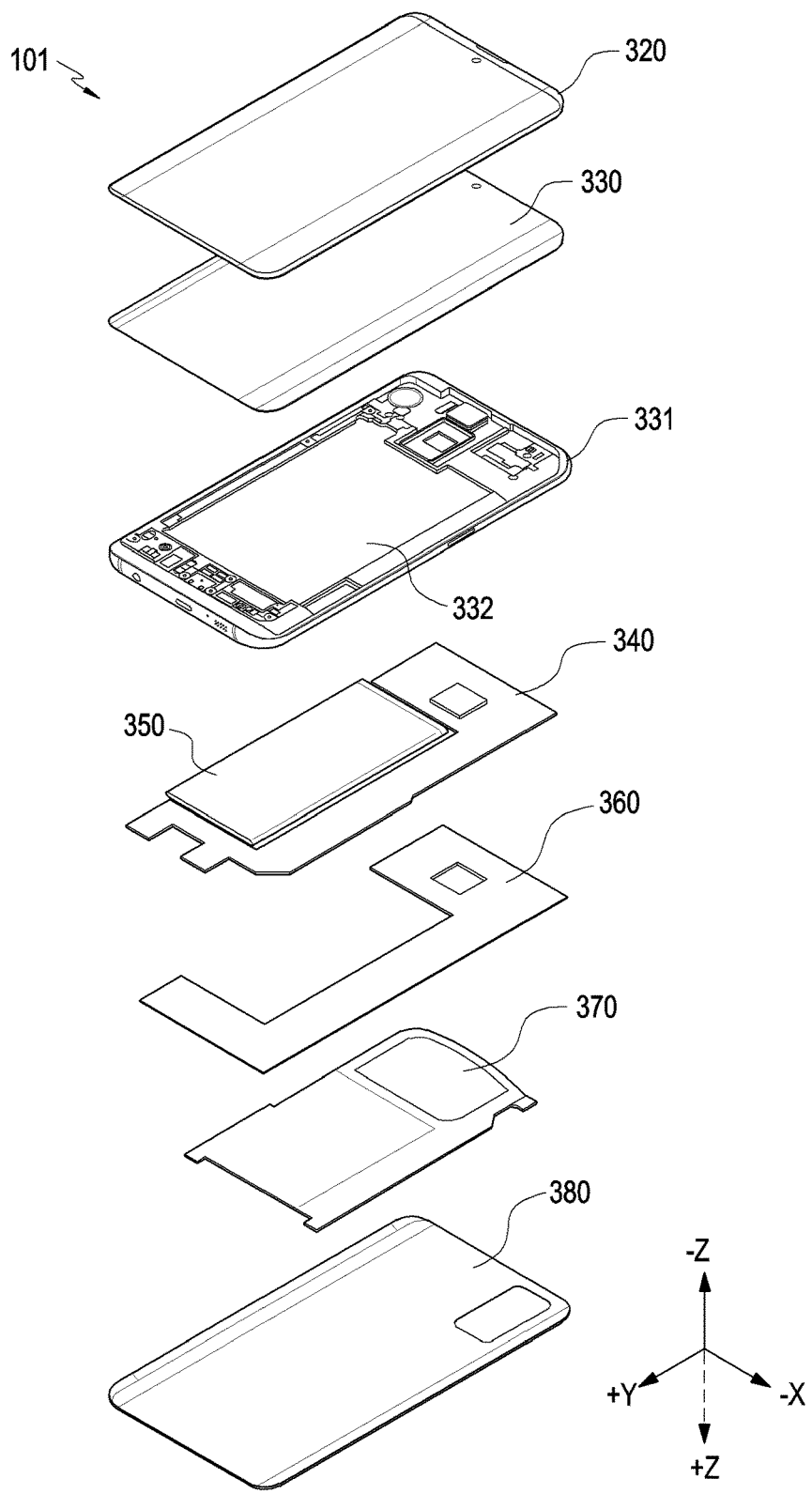
FIG. 4 is an exploded perspective view illustrating an electronic device according to various embodiments.

FIG. 4 is an exploded perspective view illustrating an electronic device according to various embodiments.

Referring to FIG. 4, the electronic device 101 (e.g., the electronic device 101 in FIGS. 1, 2 and 3) according to various embodiments may include a side bezel structure 331 (e.g., the side bezel structure 318 in FIG. 2), a first support member 332, a front plate 320 (e.g., the front plate 302 in FIG. 2), a display 330 (e.g., the display 301 in FIG. 2), a printed circuit board 340 (e.g., a PCB, flexible PCB (FPCB), or a rigid flexible PCB (RFPCB)), a battery 350 (e.g., the battery 189 in FIG. 1), a second support member 360 (e.g., the rear case), an antenna 370 (e.g., the antenna module 197 in FIG. 1), and a rear plate 380 (e.g., the rear plate 311 in FIG. 2). In various embodiments, in the electronic device 101, at least one of the components (e.g., the first support member 332 or the second support member 360) may be omitted, or other components may be additionally included. At least one of the components of the electronic device 101 may be the same as or similar to at least one of the components of the electronic device 101 in FIG. 2 or FIG. 3, and a redundant description thereof will be omitted below.

According to various embodiments, the first support member 332 may be disposed inside the electronic device 101 to be connected to the side bezel structure 331, or may be integrated with the side bezel structure 331. The first support member 332 may be formed of, for example, a metal material and/or a non-metal material (e.g., a polymer). The display 330 may be coupled to one surface of the first support member 332, and the printed circuit board 340 may be coupled to the other surface of the first support member 332.

According to various embodiments, on the printed circuit board 340, a processor, a memory, and/or an interface may be mounted. The processor may include various processing circuitry including, for example, one or more of, for example, a central processing unit, an application processor, a graphics processor, an image signal processor, a sensor hub processor, or a communication processor. According to various embodiments, the printed circuit board 340 may include a flexible printed circuit board type radio frequency cable (FRC). For example, the printed circuit board 340 may be disposed on at least a portion of the first support member 332, and may be electrically connected to an antenna module (e.g., the antenna module 197 in FIG. 1) and a communication module (e.g., the communication module 190 in FIG. 1).

According to an embodiment, the memory (e.g., the memory 130 in FIG. 1) may include, for example, a volatile memory or a nonvolatile memory.

According to an embodiment, the interface (e.g., the interface 177 in FIG. 1) may include, for example, a high definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/an MMC connector, or an audio connector.

According to various embodiments, the battery 350 (e.g., the battery 189 in FIG. 1) is a device for supplying power to at least one component of the electronic device 101, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 101, or may be detachably disposed on the electronic device 101.

According to various embodiments, the second support member 360 (e.g., the rear case) may be disposed between the printed circuit board 340 and the antenna 370. For example, the second support member 360 may include one surface to which at least one of the printed circuit board 340 and the battery 350 is coupled, and the other surface to which the antenna 370 is coupled.

According to various embodiments, the antenna 370 (e.g., the antenna module 197 in FIG. 1) may be disposed between the rear plate 380 and the display 350. The antenna 370 may include, for example, a near field communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In an embodiment, an antenna structure may be included with a part of the side bezel structure 331 and/or the first support member 332, or a combination thereof.

According to various embodiments, the rear plate 380 may define at least a portion of the rear surface (e.g., the rear surface in FIG. 3) of the electronic device 101.

Figure 5:
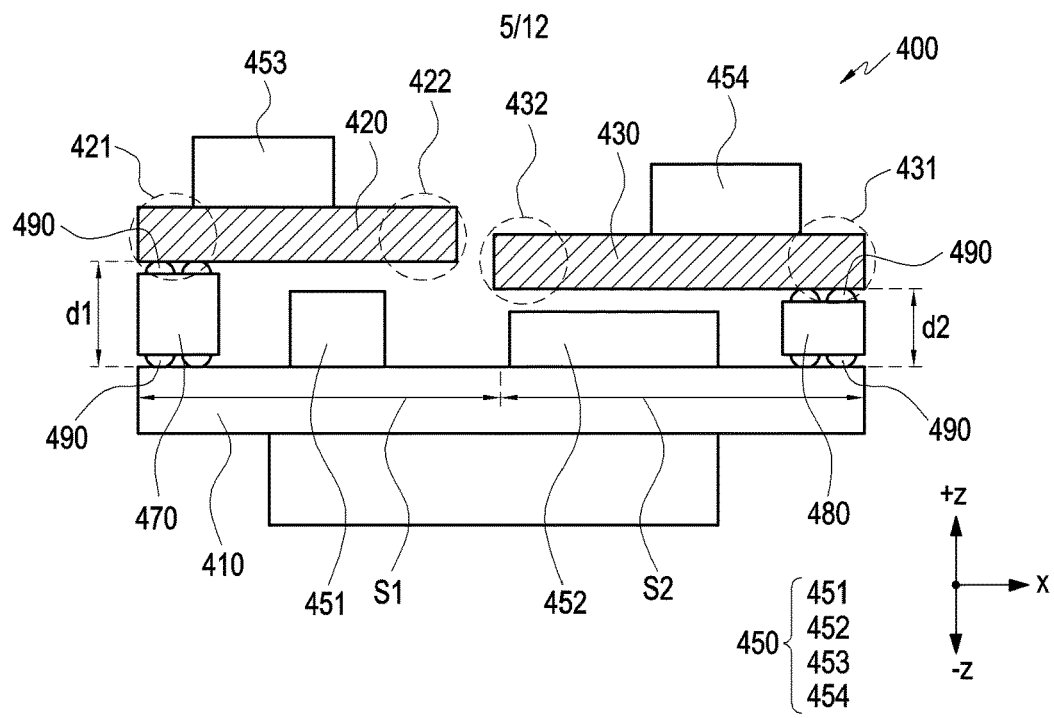
FIG. 5 is a diagram illustrating an example stacking structure in a circuit board module according to various embodiments.
Figure 6:
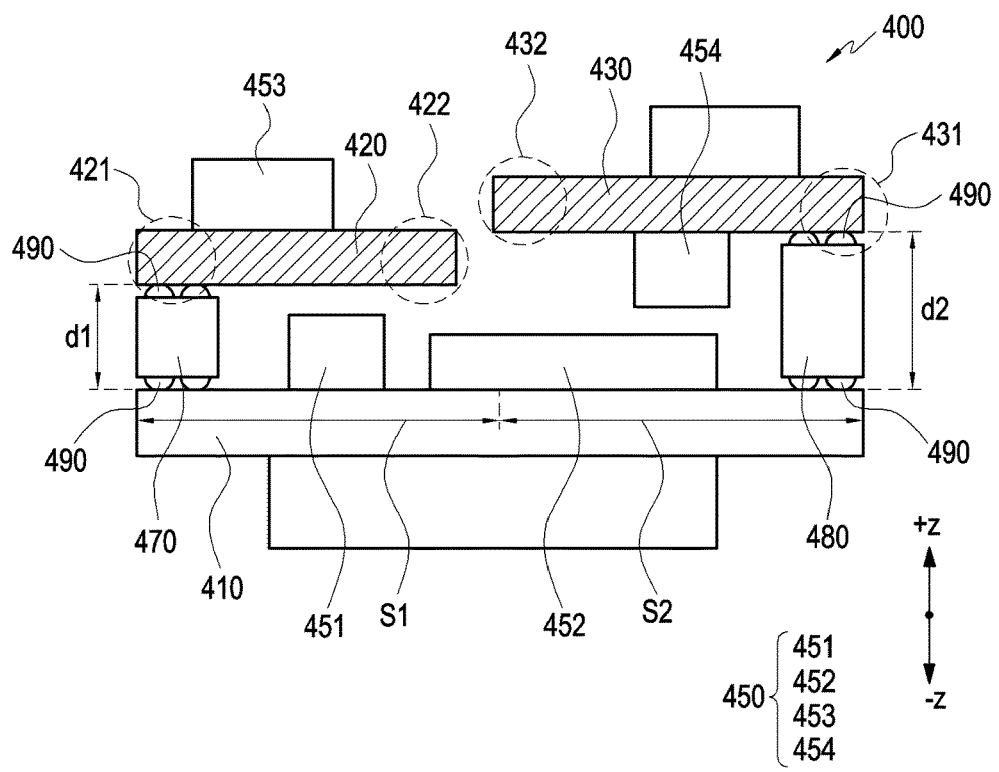
FIG. 6 is a diagram illustrating an example stacking structure in a circuit board module according to various embodiments.
Figure 7:
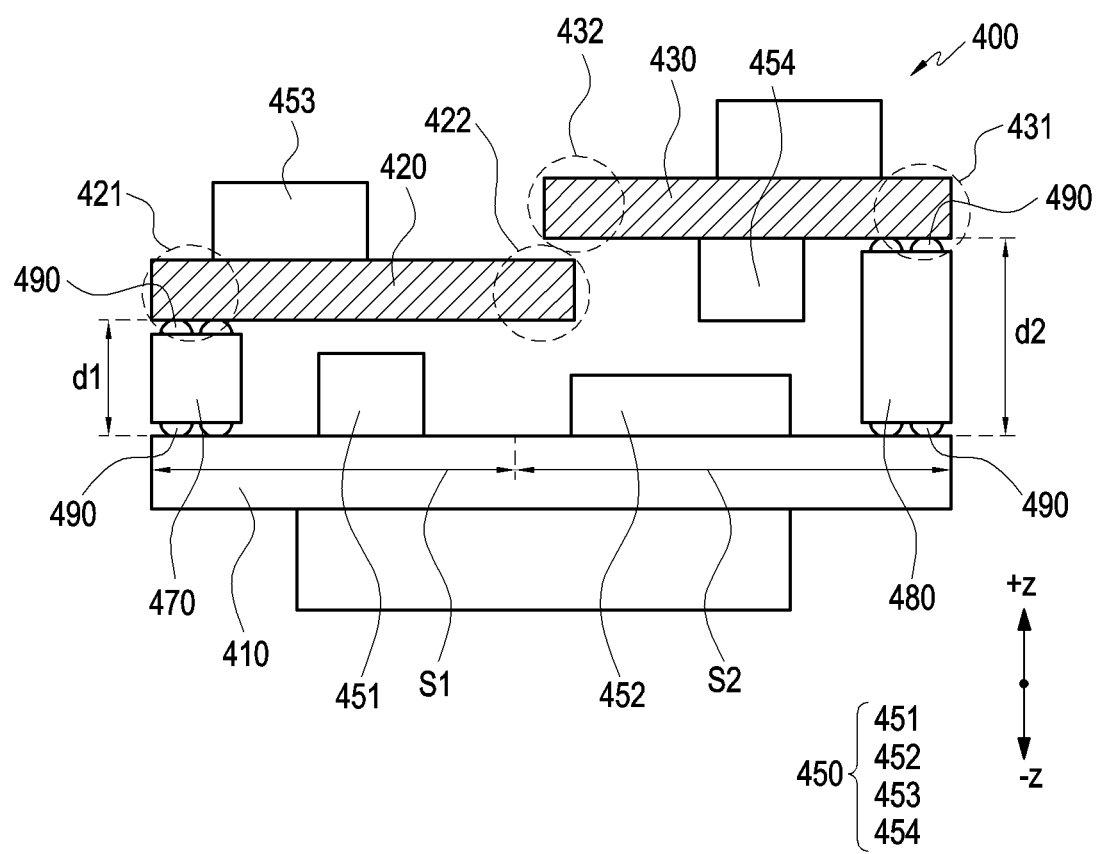
FIG. 7 is a diagram illustrating an example stacking structure in a circuit board module according to various embodiments.
Figure 8:
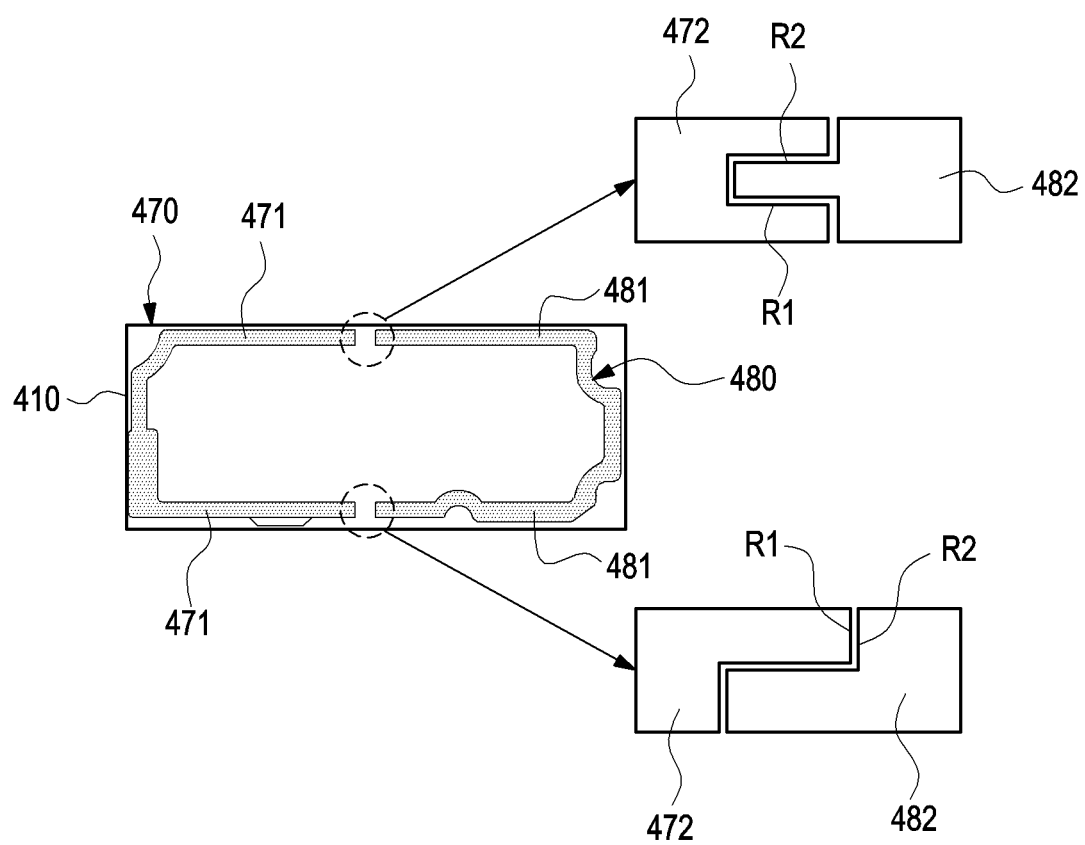
FIG. 8 is a diagram illustrating a top surface of an interposer viewed through a circuit board module according to various embodiments.

FIG. 5 is a diagram illustrating an example stacking structure in a circuit board module 400 according to various embodiments. FIG. 6 is a diagram illustrating an example stacking structure in a circuit board module 400 according to various embodiments. FIG. 7 is a diagram illustrating an example stacking structure in a circuit board module 400 according to various embodiments. FIG. 8 is a diagram illustrating a top surface of an interposer viewed through a circuit board module 400 according to various embodiments.

According to various embodiments, an electronic device (e.g., the electronic device 101 in FIGS. 1, 2, 3 and 4) may include a housing (e.g., the housing 310 in FIGS. 2A to 3), a display (e.g., the display 330 in FIG. 4), and a circuit board module 400. The circuit board module 400 may include a first circuit board 410, a second circuit board unit, interposer units (e.g., a first interposer part 470 and a second interposer part 480) disposed between the first circuit board 410 and the second circuit board unit, and components 450 mounted on the first circuit board 410 and/or the second circuit board unit. According to an embodiment, the second circuit board unit may include a plurality of circuit boards, and the interposer unit may include a plurality of interposer parts.

According to an embodiment, the configuration of the circuit board module 400 in FIGS. 5, 6, 7 and 8 may be partially or entirely the same as or similar to that of the printed circuit board 340 in FIG. 4.

In FIGS. 5, 6, 7 and 8, "Z" may refer to the thickness direction of the circuit board module 400. In addition, in an embodiment of the disclosure, "+Z" may refer a forward direction (e.g., a first direction) in which the circuit board module 400 faces a display (e.g., the display 330 in FIG. 4), and "−Z" may refer to a rearward direction (e.g., a second direction) in which the circuit board module 400 faces a rear plate (e.g., the rear plate 380 in FIG. 4).

According to various embodiments, the circuit board module 400 may include a plurality of stacked circuit boards. In each circuit board, one or more conductive layers (not illustrated) and one or more dielectric layers (not illustrated) may be alternately stacked. According to an embodiment, in the circuit board module 400, the second circuit board unit may be stacked on the first circuit board 410, and the interposer unit may be disposed between the first circuit board 410 and the second circuit board unit (e.g., a $(2-1)^{th}$ circuit board 420 and a $(2-2)^{th}$ circuit board 430) to provide a space.

According to various embodiments, the first circuit board 410 may be disposed under a display (e.g., the display 330 in FIG. 4), and a plurality of components 450 may be disposed on one surface of the first circuit board 410. At least one of the plurality of components 450 may be a heat source generating heat, and may be at least one of, for example, a power management integrated circuit (PMIC), a power amplifier (PAM), an application processor (AP), a communication processor (CP), a charge integrated circuit (IC), a display driver integrated circuit (DDI), or a communication circuit (e.g., a transceiver, an active communication device, or a passive communication device).

According to an embodiment, a first component 451 may be disposed in a first region S1 of the first circuit board 410, and a second component 452 may be disposed in a second region S2 of the first circuit board 410. According to various embodiments, the first component 451 may be disposed in the first region S1 of the first circuit board 410, and the second component 452 may be disposed over the first region S1 and the second region S2 of the first circuit board 410. According to various embodiments, the first component 451 may be disposed over the first region S1 and the second region S2 of the first circuit board 410, and the second component 452 may be disposed in the second region S2 of the first circuit board 410. The first component 451 and the second component 452 may have different heights.

According to various embodiments, the second circuit board unit may be disposed between the display (e.g., the display 330 in FIG. 4) and the first circuit board 410, and may be disposed to be spaced apart from the first circuit board 410 by a predetermined distance by interposer parts. According to an embodiment, the second circuit board unit may include a $(2-1)^{th}$ circuit board 420 and a $(2-2)^{th}$ circuit board 430, at least a portion of the $(2-1)^{th}$ circuit board 420 may be located above the first region S1 of the first circuit board 410, and at least a portion of the $(2-2)^{th}$ circuit board 430 may be located above the second region S2 of the first circuit board 410.

According to an embodiment, one or more components may be disposed on one surface of the $(2-1)^{th}$ circuit board 420 and/or the $(2-2)^{th}$ circuit board 430. The one or more components may be one or more of, for example, a power management integrated circuit (PMIC), a power amplifier (PAM), an application processor (AP), a communication processor (CP), a charge integrated circuit (IC), a display driver integrated circuit (DDI), or a communication circuit (e.g., a transceiver, an active communication device, or a passive communication device). According to an embodiment, a third component 453 may disposed on one surface of the $(2\text{-}1)^{th}$ circuit board 420 oriented in a first direction (+Z-axis direction) or one surface oriented in a second direction (−Z-axis direction). The third component 453 may be disposed to face the first region S1 of the first circuit board 410 or the first component 451 disposed in the first region S1. A fourth component 454 may be disposed on one surface of the $(2\text{-}2)^{th}$ circuit board 430 oriented in the first direction (+Z-axis direction) or one surface oriented in the second direction (−Z-axis direction). The fourth component 454 may be disposed to face the second region S2 of the first circuit board 410 or the second component 452 disposed in the second region S2. According to this embodiment, the spaces in which components are disposed on the top and bottom surfaces of each of the stacked circuit boards can be expanded so that the internal mounting spaces of the electronic device can be efficiently used.

According to an embodiment, the $(2\text{-}1)^{th}$ circuit board 420 may be disposed to be spaced apart from the first region S1 of the first circuit board 410 by a first distance d1 (e.g., height), and the $(2\text{-}2)^{th}$ circuit board 430 may be disposed to be spaced apart from the second region S2 of the first circuit board 410 by a second distance d2 (e.g., height). The first distance d1 and the second distance d2 may be different from each other. For example, referring to FIG. 5, when the height of the first component 451 disposed in the first region S1 is greater than the height of the second component 452 disposed in the second region S2, the first distance d1 may be designed to be greater than the second distance d2. As another example, referring to FIG. 6, when the height of the first component 451 disposed in the first region S1 is smaller than the height of the second component 452 disposed in the second region S2, the first distance d1 may be designed to be smaller than the second distance d2. As still another example, referring to FIG. 6, when the first component 451 is disposed in the first region S1 of the first circuit board 410, the second component 452 and the fourth component 454 are disposed between the second region S2 of the first circuit board 410 and the $(2\text{-}2)^{th}$ circuit board 430 to face each other, and the sum of the heights of the second component 452 and the fourth component 454 are greater than the height of the first component 451, the second distance d2 may be designed to be greater than the first distance d1. As still another example, when the first component 451 and the third component 453 are disposed to face each other between the first region S1 of the first circuit board 410 and the $(2\text{-}1)^{th}$ circuit board 420, the second component 452 is disposed in the second region S2 of the first circuit board 410, and the sum of the heights of the first component 451 and the third component 453 is greater than that of the second component 452, the first distance d1 may be designed to be greater than the second distance d2.

According to an embodiment, the $(2\text{-}1)^{th}$ circuit board 420 and the $(2\text{-}2)^{th}$ circuit board 430 may be spaced apart from each other by a predetermined gap in the horizontal or vertical direction. For example, the $(2\text{-}1)^{th}$ circuit board 420, which is spaced apart from the first circuit board 410 by the first distance d1, and the $(2\text{-}2)^{th}$ circuit board 430, which is spaced apart from the first circuit board 410 by the second distance d2, may be disposed to be spaced apart from each other in the vertical direction (e.g., the first direction (+Z-axis direction) or the second direction (−Z-axis direction)). As still another example, when the $(2\text{-}1)^{th}$ circuit board 420 is disposed to face only a partial region of the first region S1 (e.g., a region that is not adjacent to the second region S2) and the $(2\text{-}2)^{th}$ circuit board 430 is disposed to face only a partial region of the second region S2 (e.g., a region that is not adjacent to the first region S1), the $(2\text{-}1)^{th}$ circuit board 420 and the $(2\text{-}2)^{th}$ circuit board 430 may be disposed to be spaced apart from each other in the horizontal direction (e.g., the third direction (X-axis direction)).

Referring to FIG. 7, according to an embodiment, at least a partial region of the $(2\text{-}1)^{th}$ circuit board 420 and at least a partial region of the $(2\text{-}2)^{th}$ circuit board 430 may be disposed to overlap each other. For example, the $(2\text{-}1)^{th}$ circuit board 420 and the $(2\text{-}2)^{th}$ circuit board 430 may be spaced apart from the first circuit board 410 by different distances. When the $(2\text{-}1)^{th}$ circuit board 420 is disposed to face the first region S1 of the first circuit board 410 and the second region S2 adjacent to the first region S1 or the $(2\text{-}2)^{th}$ circuit board 430 is disposed to face the second region S2 of the first circuit board 410 and the first region S1 adjacent to the second region S2, an end portion of the $(2\text{-}1)^{th}$ circuit board 420 (e.g., a $(1\text{-}2)^{th}$ portion 422) and an end portion of the $(2\text{-}2)^{th}$ circuit board 430 (e.g., a $(2\text{-}2)^{th}$ portion 432) may be disposed to overlap each other when the $(2\text{-}1)^{th}$ circuit board 420 and/or the $(2\text{-}2)^{th}$ circuit board 430 are viewed from above.

According to an embodiment, the $(2\text{-}1)^{th}$ circuit board 420 may include a $(1\text{-}1)^{th}$ portion 421 and a $(1\text{-}2)^{th}$ portion 422 opposite to the $(1\text{-}1)^{th}$ portion 421, the $(1\text{-}1)^{th}$ portion 421 may be a portion bonded to the first interposer part 470 through soldering, and the $(1\text{-}2)^{th}$ portion 422 may be a portion facing the $(2\text{-}2)^{th}$ circuit board 430. The $(2\text{-}2)^{th}$ circuit board 430 may include a $(2\text{-}1)^{th}$ portion 431 and a $(2\text{-}2)^{th}$ portion 432 opposite to the $(2\text{-}1)^{th}$ portion 431, the $(2\text{-}1)^{th}$ portion 431 may be a portion bonded to the second interposer part 480 through soldering, and the $(2\text{-}2)^{th}$ portion 432 may be a portion facing the $(2\text{-}1)^{th}$ circuit board 420. The $(1\text{-}2)^{th}$ portion 422 and the $(2\text{-}2)^{th}$ portion 432 may at least partially be spaced apart from and face each other in the horizontal direction, or may be spaced apart from and face each other in the vertical direction.

According to various embodiments, the interposer part may be disposed between the first circuit board 410 and the second circuit board unit. The interposer unit may include a plurality of portions, but may be manufactured generally in a closed loop shape. For example, the interposer unit may include a first interposer part 470 disposed in the first region S1 of the first circuit board 410 and a second interposer part 480 disposed in the second region S2 of the first circuit board 410.

According to an embodiment, the first interposer part 470 may be disposed between the first region S1 of the first circuit board 410 and the $(2\text{-}1)^{th}$ circuit board 420. For example, the first region S1 of the first circuit board 410 may be disposed on one surface of the first interposer part 470 oriented in the second direction (−Z-axis direction), and the $(2\text{-}1)^{th}$ circuit board 420 may be disposed on one surface of the first interposer part 470 oriented in the first direction (+Z-axis direction). According to an embodiment, the first interposer part 470 may be disposed along the first region S1 of the first circuit board 410/an edge of the $(2\text{-}1)^{th}$ circuit board 420. When the first component 451 is disposed on the top surface (the surface oriented in the first direction (+Z-axis direction)) of the first region S1 of the first circuit board 410 or the third component 453 is disposed on the bottom surface (the surface oriented in the second direction (−Z-axis direction)) of the $(2\text{-}1)^{th}$ circuit board 420 to face the first region S1, the first interposer part 470 may be disposed to surround the first component and/or the third component 453 to prevent and/or inhibit the first component and/or the third component 453 from being exposed to the outside.

According to an embodiment, the top surface (the surface oriented in the first direction (+Z-axis direction)) of the first interposer part 470 may be bonded to the $(2-1)^{th}$ circuit board 420 using solder 490, and the bottom surface (the surface oriented in the second direction (−Z-axis direction) of the first interposer part 470 may be bonded to the first circuit board 410 using solder 490.

According to an embodiment, the second interposer part 480 may be disposed between the second region S2 of the first circuit board 410 and the $(2-2)^{th}$ circuit board 430. For example, the second region S2 of the first circuit board 410 may be disposed on one surface of the second interposer part 480 oriented in the second direction (−Z-axis direction), and the $(2-2)^{th}$ circuit board 430 may be disposed on one surface of the second interposer part 480 oriented in the first direction (+Z-axis direction). According to an embodiment, the second interposer part 480 may be disposed along the second region S2 of the first circuit board 410/an edge of the $(2-2)^{th}$ circuit board 430. When the second component 452 is disposed on the top surface (the surface oriented in the first direction (+Z-axis direction)) of the second region S2 of the first circuit board 410 or the fourth component 454 is disposed on the bottom surface (the surface oriented in the second direction (−Z-axis direction)) of the $(2-2)^{th}$ circuit board 430 to face the second region S2, the second interposer part 480 may be disposed to surround the second component 452 and/or the fourth component 454 to prevent and/or inhibit the second component and/or the fourth component 454 from being exposed to the outside.

According to an embodiment, the top surface (the surface oriented in the first direction (+Z-axis direction)) of the second interposer part 480 may be bonded to the $(2-2)^{th}$ circuit board 430 using solder 490, and the bottom surface (the surface oriented in the second direction (−Z-axis direction) of the second interposer part 480 may be bonded to the first circuit board 410 using solder 490.

According to various embodiments, the first interposer part 470 may include line portions 471 including a linear shape and opposite end portions 472 to be connected with the second interposer part 480 or another interposer part. The line portions 471 may include a linear structure and/or a curved structure. For example, the edge regions of the first region S1 of the first circuit board 410 may be manufactured generally in a linear shape, and the line portions 471 may be provided in a shape corresponding to the edge regions and bonded to the same through solder.

According to an embodiment, the cross-sectional shape of the opposite end portions 472 of the first interposer part 470 may be manufactured in a shape having a flat surface or a stepped surface. However, the shapes of the line portions 471 and the opposite end portions 472 of the first interposer part 470 are not limited thereto and may be changed in design to have various shapes corresponding to the first circuit board 410 and the end portions of other interposer parts.

According to an embodiment, the second interposer part 480 may include line portions 481 including a linear shape and opposite end portions 482 to be connected with the first interposer part 470 or another interposer part. For example, the edge regions of the second region S2 of the first circuit board 410 may be manufactured generally in a linear shape, and the line portions 481 may be provided in a shape corresponding to the edge regions and bonded to the same through solder. As still another example, the cross-sectional shape of the opposite end portions 482 may be manufactured in a shape including a flat surface or a stepped surface. However, the shapes of the line portions 481 and the opposite end portions 482 of the second interposer part 480 are not limited thereto and may be changed in design to have various shapes corresponding to the first circuit board 410 and the end portions of other interposer parts.

According to an embodiment, the opposite end portions 472 of the first interposer part 470 and the opposite end portions 482 of the second interposer part 480 may be disposed to face each other. For example, the first interposer part 470 may be manufactured generally in a " ⊏ " shape, and the second interposer part 480 may be manufactured generally in an " ⊐ " shape. The first and second interposer parts 470 and 480 may be connected to each other. According to an embodiment, one surface of the first end portion R1 of the first interposer part 470 and one surface of the second end portion R2 of the second interposer part 480 that face each other may include flat regions, respectively. For example, the flat region of the first end portion R1 and the flat region of the second end portion R2 may be disposed to be spaced apart from each other by a predetermined distance or more. According to an embodiment, the first end portion R1 of the first interposer part 470 and the second end portion R2 of the second interposer part 480 may be provided in stepped shapes, respectively. Each of the first end portion R1 and the second end portion R2 may include a dummy portion in which one region further protrudes, and may be connected to each other in a fitting manner According to an embodiment, the first end portion R1 and the second end portion R2, each including a stepped shape, may at least partially overlap each other when viewed from a side of the first interposer part 470 or the second interposer part 480.

In general, in a multilayer circuit board module, empty spaces may exist inside the module according to the thicknesses of various components, which may limit the miniaturization of the circuit board module. In addition, due to an interposer having a closed loop shape, bending and/or lifting may occur in a high-temperature section. With the circuit board module 400 according to the disclosure, it is possible to improve the mounting spaces inside a circuit board module and to prevent and/or reduce bending and/or lifting using separated circuit boards (e.g., the $(2-1)^{th}$ circuit board 420 and the $(2-2)^{th}$ circuit board 430) and separated interposer parts (e.g., the first interposer part 470 and the second interposer part 480).

Figure 9A:
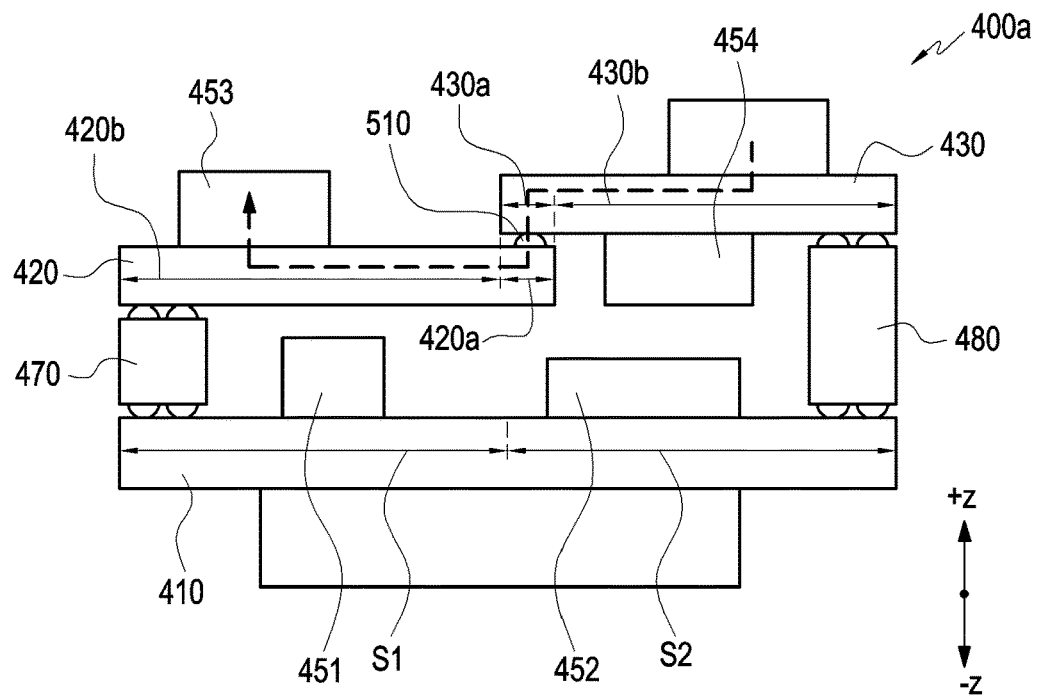
FIG. 9A is a diagram illustrating an example stacking structure in a circuit board module according to various embodiments.
Figure 9B:
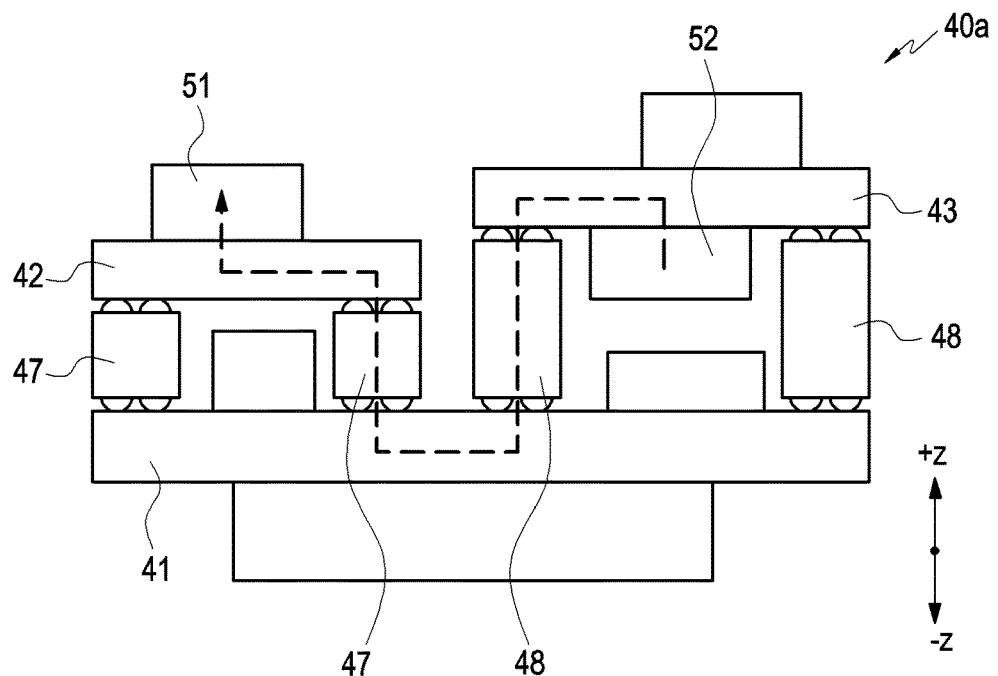
FIG. 9B is a diagram illustrating an example stacking structure in a conventional circuit board module.

FIG. 9A is a diagram illustrating an example stacking structure in a circuit board module 400a according to various embodiments. FIG. 9B is a diagram illustrating a stacking structure in one of conventional circuit board modules 40a.

Figure 10:
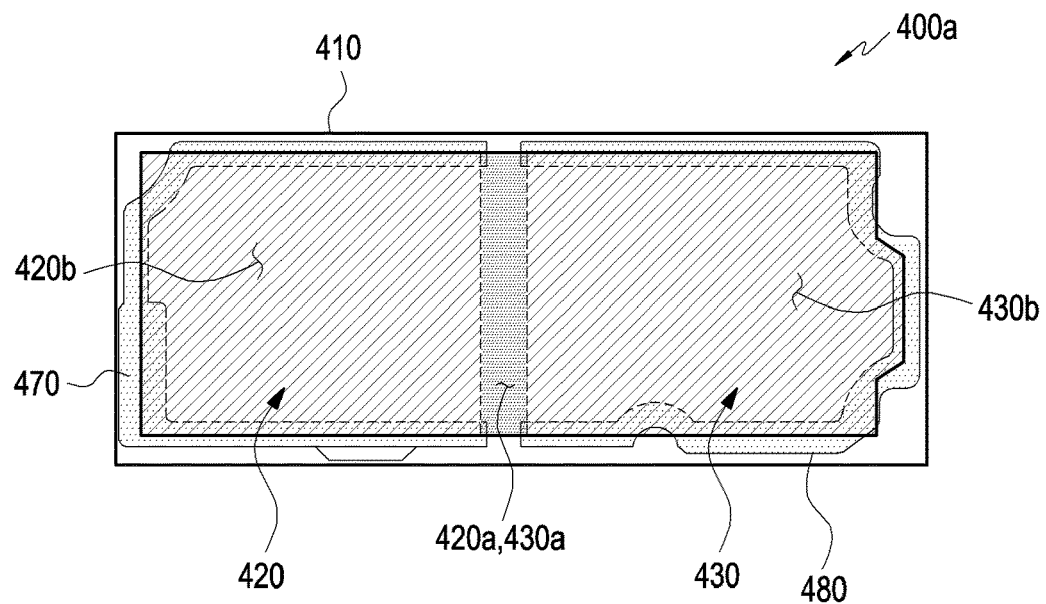
FIG. 10 is a top view of the circuit board module of FIG. 9A according to various embodiments.

FIG. 10 is a top view of the circuit board module 400a of FIG. 9A according to various embodiments.

According to various embodiments, the circuit board module 400a may include a first circuit board 410, a $(2-1)^{th}$ circuit board 420, a $(2-2)^{th}$ circuit board 430, a first interposer part 470 disposed between the first circuit board 410 and the $(2-1)^{th}$ circuit board 420, and a second interposer part 480 disposed between the first circuit board 410 and the $(2-2)^{th}$ circuit board 430.

According to an embodiment, the configuration of the circuit board module 400a in FIGS. 9A and 10 may be partially or entirely the same as or similar to that of the printed circuit board 400 in FIGS. 5, 6, 7 and 8. Hereinafter, a configuration different from that of the circuit board module 400 of FIGS. 5, 6, 7 and 8 will be mainly described.

In FIGS. 9A and 9B, "Z" may refer of the thickness direction of the circuit board module 400a. In addition, in an embodiment of the disclosure, "+Z" may refer to a forward direction (e.g., a first direction) in which the circuit board module 400a faces a display (e.g., the display 330 in FIG. 4), and "−Z" may refer to a rearward direction (e.g., a second direction) in which the circuit board module 400a faces a rear plate (e.g., the rear plate 380 in FIG. 4).

Referring to FIGS. 9A, 9B and 10, at least a partial region of the $(2-1)^{th}$ circuit board 420 and at least a partial region of the $(2-2)^{th}$ circuit board 430 may be disposed to overlap each other. The overlapped partial regions are portions that may be bonded to each other through soldering, and may electrically connect the $(2-1)^{th}$ circuit board 420 and the $(2-2)^{th}$ circuit board 430.

According to an embodiment, the $(2-1)^{th}$ circuit board 420 may include a first portion 420a adjacent to the $(2-2)^{th}$ circuit board 430 and a second portion 420b extending from the first portion 420a. The second portion 420b may be a portion facing the first region S1 of the first circuit board 410, and the first portion 420a may be a portion facing a portion of the second region S2 of the first circuit board 410. The $(2-2)^{th}$ circuit board 430 may include a third portion 430a facing the first portion 420a and a fourth portion 430b extending from the third portion 430a. The third portion 430a and the fourth portion 430b may be portions facing the second region S2 of the first circuit board 410. The first portion 420a of the $(2-1)^{th}$ circuit board 420 and the third portion 430a of the $(2-2)^{th}$ circuit board 430 are overlapping regions, and may be electrically connected to each other through soldering. As the solder 510 used in the soldering process, a low-temperature solder having a melting temperature of 200 degrees C. or lower may be used. According to an embodiment, the height of the first interposer part 470 may be different from the height of the second interposer part 480. For example, the sum of the heights of components (e.g., the first component 451) located on or above the first region S1 of the first circuit board 410 may be smaller than the sum of the heights of the components (e.g., the second component 452 and the fourth component 454) located on or above the second region S2 of the first circuit board 410 (+Z-axis direction). In this case, the height of the second interposer part 480 may be greater than that of the first interposer part 470, and the $(2-2)^{th}$ circuit board 430 disposed on the second interposer part 480 may be located to be more spaced apart from the first circuit board 410 than from the $(2-1)^{th}$ circuit board 420.

According to an embodiment, the $(2-1)^{th}$ circuit board 420 may include a first portion (not illustrated) adjacent to the $(2-2)^{th}$ circuit board 430 and a second portion (not illustrated) extending from the first portion. The first portion and the second portion may be portions facing the first region S1 of the first circuit board 410. The $(2-2)^{th}$ circuit board 430 may include a third portion (not illustrated) facing the first portion and a fourth portion (not illustrated) extending from the third portion. The fourth portion may be a portion facing the second region S2 of the first circuit board 410, and the third portion may be a portion facing a portion of the first region S1 of the first circuit board 410. The first portion of the $(2-1)^{th}$ circuit board 420 and the third portion of the $(2-2)^{th}$ circuit board 430 are overlapping regions, and may be electrically connected to each other through soldering. According to an embodiment, the height of the first interposer part 470 may be different from the height of the second interposer part 480. For example, the sum of the height(s) of component(s) located on or above the first region S1 of the first circuit board 410 may be greater than the sum of the height(s) of the component(s) located on or above the second region S2 of the first circuit board 410. In this case, the height of the first interposer part 470 may be greater than that of the second interposer part 480, and the $(2-1)^{th}$ circuit board 420 disposed on the first interposer part 470 may be located to be more spaced apart from the first circuit board 410 than from the $(2-2)^{th}$ circuit board 430.

According to various embodiments, the overlapping structure of the $(2-1)^{th}$ circuit board 420 and the $(2-2)^{th}$ circuit board 430 may shield electromagnetic interference (EMI) noise. The circuit board module 400a including the overlapping structure of the $(2-1)^{th}$ circuit board 420 and the $(2-2)^{th}$ circuit board 430 and the connection structure through solder 510 is able to reduce a wiring loss by shortening a signal path in comparison with a conventional circuit board module (e.g., the circuit board 40a in FIG. 9). For example, a signal generated from a component mounted on the $(2-2)^{th}$ circuit board 430 (e.g., the fourth component 454 in FIG. 9A) may be transmitted to a component (e.g., the third component 453 in FIG. 9A) mounted on the $(2-1)^{th}$ circuit board 420 via the $(2-2)^{th}$ circuit board 430, the solder 510, and the $(2-1)^{th}$ circuit board 420. In the conventional circuit board module 40a according to FIG. 9B, a signal generated from a component 52 mounted on the $(2-2)^{th}$ circuit board 43 may be transmitted to the first circuit board 41 via the second interposer part 48 having a closed loop shape and soldered between the $(2-2)^{th}$ circuit board 43 and the first circuit board 41. Thereafter, the signal may be transmitted to a component 51 mounted on the $(2-1)^{th}$ circuit board 42 via the first interposer part 47 having a closed loop shape and soldered between the $(2-1)^{th}$ circuit board 42 and the first circuit board 41.

Figure 11:
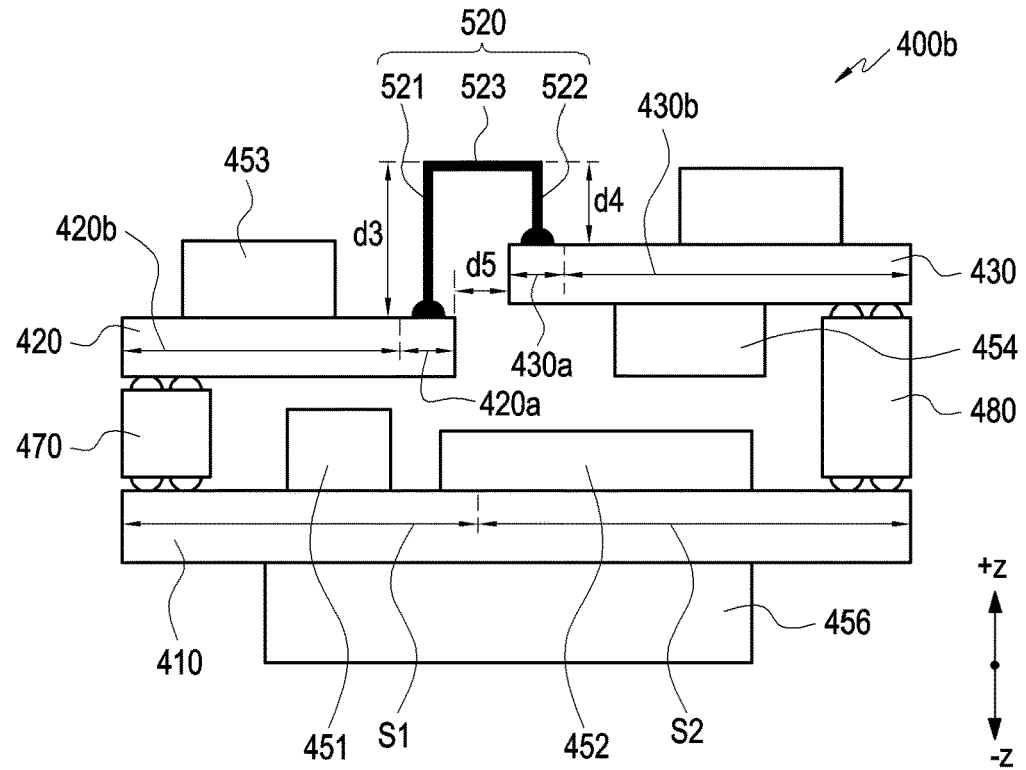
FIG. 11 is a diagram illustrating an example stacking structure in a circuit board module according to various embodiments.

FIG. 11 is a diagram illustrating an example stacking structure in a circuit board module 400b according to various embodiments.

Figure 12:
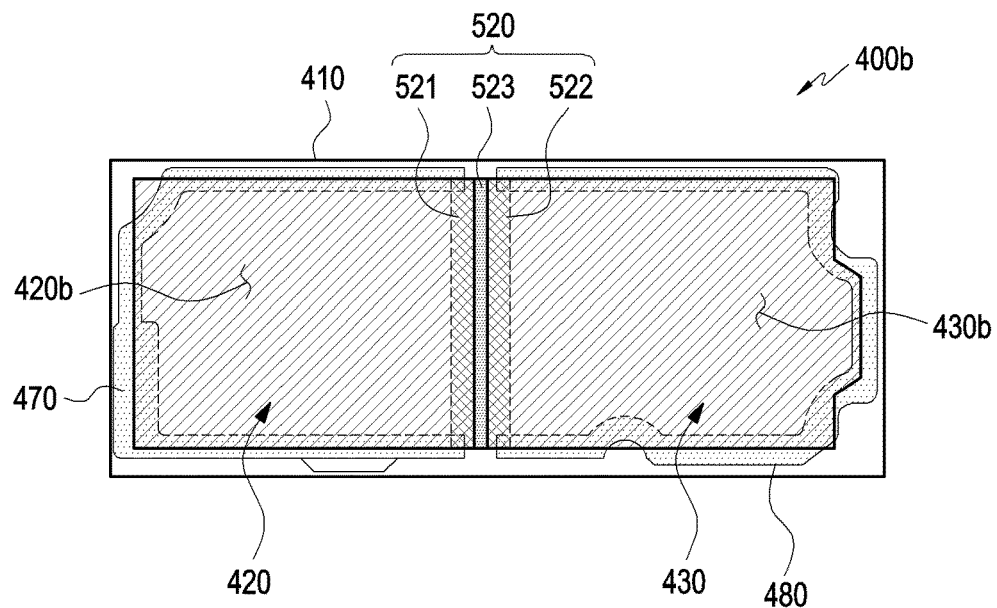
FIG. 12 is a top view of the circuit board module of FIG. 11 according to various embodiments.

FIG. 12 is a top view of the circuit board module 400b of FIG. 11 according to various embodiments.

According to various embodiments, the circuit board module 400b may include a first circuit board 410, a $(2-1)^{th}$ circuit board 420, a $(2-2)^{th}$ circuit board 430, a first interposer part 470 disposed between the first circuit board 410 and the $(2-1)^{th}$ circuit board 420, and a second interposer part 480 disposed between the first circuit board 410 and the $(2-2)^{th}$ circuit board 430.

According to an embodiment, the configuration of the circuit board module 400b in FIGS. 11 and 12 may be partially or entirely the same as or similar to that of the printed circuit board 400 in FIGS. 5, 6, 7 and 8. Hereinafter, a configuration different from that of the circuit board module 400 of FIGS. 5, 6, 7 and 8 will be mainly described.

In FIG. 11, "Z" may refer to the thickness direction of the circuit board module 400b. In addition, in an embodiment of the disclosure, "+Z" may refer to a forward direction (e.g., a first direction) in which the circuit board module 400b faces a display (e.g., the display 330 in FIG. 4), and "−Z" may refer to a rearward direction (e.g., a second direction) in which the circuit board module 400b faces a rear plate (e.g., the rear plate 380 in FIG. 4).

Referring to FIGS. 11 and 12, the $(2-1)^{th}$ circuit board 420 and the $(2-2)^{th}$ circuit board 430 are spaced apart from each other, and respective end portions of thereof may be electrically connected to each other via a metal structure 520.

According to an embodiment, the $(2-1)^{th}$ circuit board 420 may include a first portion 420a adjacent to the $(2-2)^{th}$ circuit board 430 and a second portion 420b extending from the first portion 420a. The first portion 420a and the second portion 420b may be portions facing the first region S1 of the first circuit board 410. The entire edge region of the bottom surface of the second portion 420b may be bonded to the first interposer part 470 through soldering, and the edge region of the bottom surface of the first portion 420a may be partially bonded to the first interposer part 470 through soldering. The (2-2)$^{th}$ circuit board 430 may include a third portion 430a facing the first portion 420a and a fourth portion 430b extending from the third portion 430a. The third portion 430a and the fourth portion 430b may be portions facing the second region S2 of the first circuit board 410. The entire edge region of the bottom surface of the fourth portion 430b may be bonded to the second interposer part 480 through soldering, and the edge region of the bottom surface of the third portion 430a may be partially bonded to the second interposer part 480 through soldering.

According to an embodiment, the first portion 420a of the (2-1)$^{th}$ circuit board 420 and the third portion 430a of the (2-2)$^{th}$ circuit board 430 may be disposed to be spaced apart from each other in the horizontal direction and/or the vertical direction, and may be electrically connected to each other via a metal structure 520. The metal structure 520 may include a first bridge 521, a second bridge 522, and a connection portion 523 connecting the first bridge 521 and the second bridge 522 to each other. The first bridge 521 is disposed to be coupled to the top surface (the surface oriented in the first direction (+Z-axis direction)) of the first portion 420a of the (2-1)$^{th}$ circuit board 420, and the second bridge 522 may be disposed to be coupled to the top surface (the surface oriented in the first direction (+Z-axis direction)) of the third portion 430a of the (2-2)$^{th}$ circuit board 430. The connection portion 523 may have a length equal to or greater than a horizontal gap d5 between the (2-1)$^{th}$ circuit board 420 and the (2-2)$^{th}$ circuit board 430. The metal structure 520 may include a material using a metal element, such as Cu, Au, Ag, Ni, Zn, Mg, or Fe, as a mixture.

According to an embodiment, the height of the first interposer part 470 may be different from the height of the second interposer part 480. For example, the sum of the heights of components (e.g., the first component 451) located on or above the first region S1 of the first circuit board 410 may be smaller than the sum of the heights of the components (e.g., the second component 452 and the fourth component 454) located on or above the second region S2 of the first circuit board 410. In this case, the height of the second interposer part 480 may be greater than that of the first interposer part 470, and the (2-2)$^{th}$ circuit board 430 disposed on the second interposer part 480 may be located to be more spaced apart from the first circuit board 410 than from the (2-1)$^{th}$ circuit board 420. In the illustrated embodiment, in the metal structure 520 connecting the (2-1)$^{th}$ circuit board 420 and the (2-2)$^{th}$ circuit board 430 to each other, in order to maintain the connection portion 523 in the horizontal state, the second length d3 (e.g., the height) of the first bridge 521 may be designed to be greater than the length d4 (e.g., the height) of the second bridge 522. However, the shape of the metal structure 520 is not limited to the illustrated embodiment, and may be changed in design in various ways to be efficiently electrically connected to the (2-1)$^{th}$ circuit board 420 and the (2-2)$^{th}$ circuit board 430.

According to an embodiment, since the space by which the (2-1)$^{th}$ circuit board 420 and the (2-2)$^{th}$ circuit board 430 are spaced apart from each other is entirely covered by the metal structure 520, EMI noise generated inside the circuit board module 400b can be blocked without going out to the external space.

Figure 13:
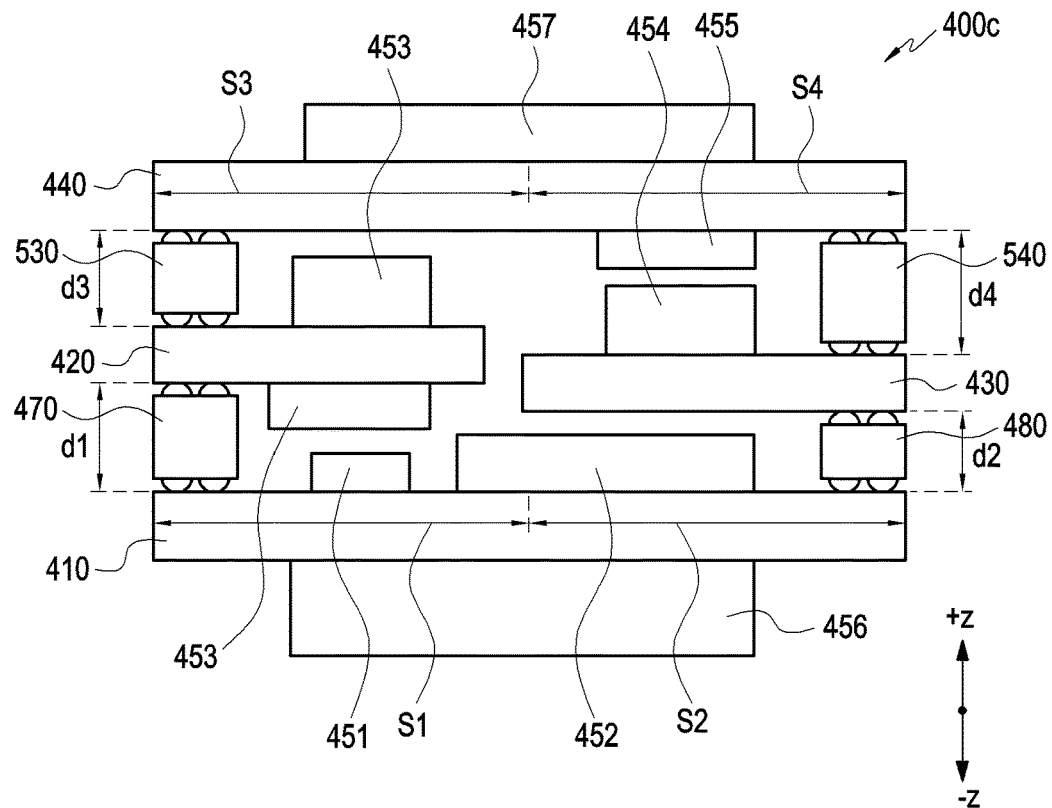
FIG. 13 is a diagram illustrating an example stacking structure in a circuit board module according to various embodiments.
Figure 14:
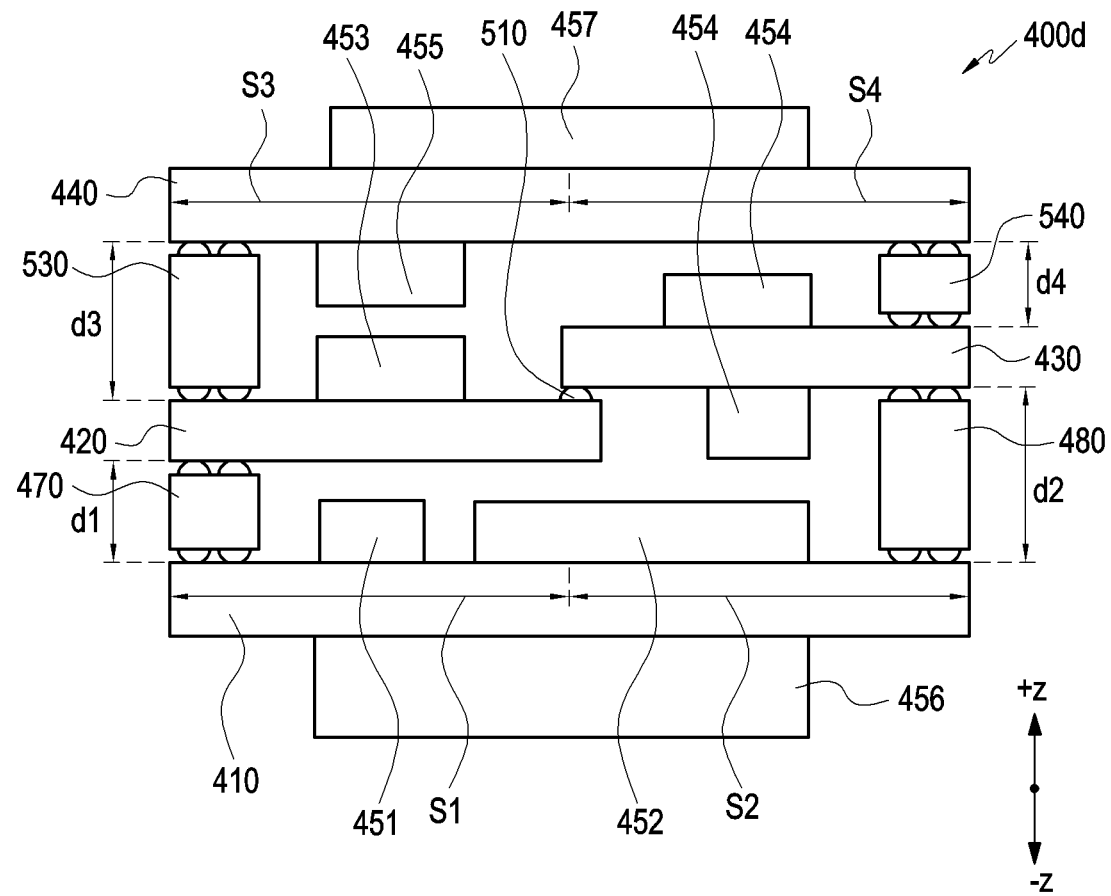
FIG. 14 is a diagram illustrating an example stacking structure in a circuit board module according to various embodiments of the disclosure.
Figure 15:
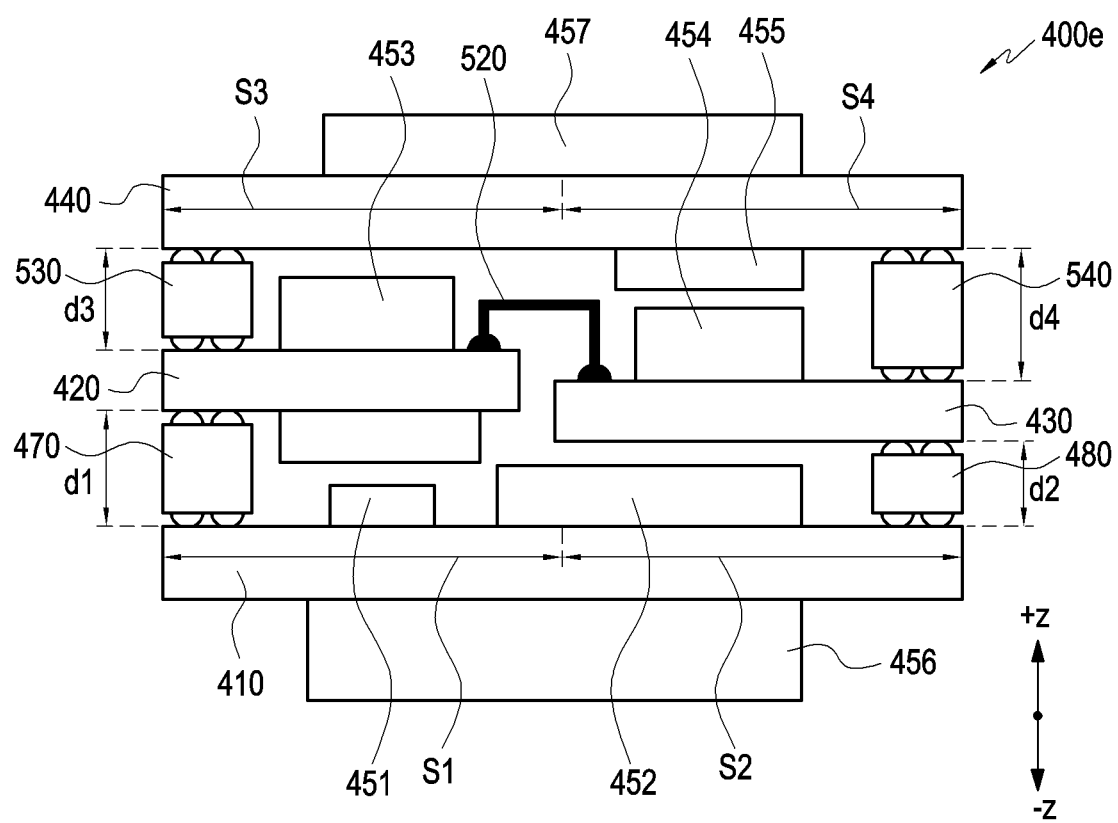
FIG. 15 is a diagram illustrating an example stacking structure in a circuit board module according to various embodiments of the disclosure.

FIG. 13 is a diagram illustrating an example stacking structure in a circuit board module 400c according to various embodiments. FIG. 14 is a diagram illustrating an example stacking structure in a circuit board module 400d according to various embodiments. FIG. 15 is a diagram illustrating an example stacking structure in a circuit board module 400e according to various embodiments.

According to various embodiments, the circuit board module 400c, 400d, or 400e may include a first circuit board 410, a (2-1)$^{th}$ circuit board 420, a (2-2)$^{th}$ circuit board 430, a first interposer part 470 disposed between the first circuit board 410 and the (2-1)$^{th}$ circuit board 420, and a second interposer part 480 disposed between the first circuit board 410 and the (2-2)$^{th}$ circuit board 430. According to an embodiment, the circuit board module 400c, 400d, or 400e may include a third circuit board 440, a third interposer part 530 disposed between the third circuit board 440 and the (2-1)$^{th}$ circuit board 420, and a fourth interposer part 540 disposed between the third circuit board 440 and the (2-2)$^{th}$ circuit board 430.

According to an embodiment, the structures of the first circuit board 410, the (2-1)$^{th}$ circuit board 420, the (2-2)$^{th}$ circuit board 430, the first interposer part 470, and the second interposer part 480 of the circuit board module 400c of FIG. 13 may be partially or entirely the same as or similar to those of the first circuit board 410, the (2-1)$^{th}$ circuit board 420, the (2-2)$^{th}$ circuit board 430, the first interposer part 470, and the second interposer part 480 of the circuit board module 400 of FIGS. 5 to 8.

According to an embodiment, the structures of the first circuit board 410, the (2-1)$^{th}$ circuit board 420, the (2-2)$^{th}$ circuit board 430, the first interposer part 470, the second interposer part 480, and the solder 510 of the circuit board module 400d of FIG. 14 may be partially or entirely the same as or similar to those of the first circuit board 410, the (2-1)$^{th}$ circuit board 420, the (2-2)$^{th}$ circuit board 430, the first interposer part 470, the second interposer part 480, and the solder 510 of the circuit board module 400a of FIGS. 9A and 10.

According to an embodiment, the structures of the first circuit board 410, the (2-1)$^{th}$ circuit board 420, the (2-2)$^{th}$ circuit board 430, the first interposer part 470, the second interposer part 480, and the metal structure 520 of the circuit board module 400e of FIG. 15 may be partially or entirely the same as or similar to those of the first circuit board 410, the (2-1)$^{th}$ circuit board 420, the (2-2)$^{th}$ circuit board 430, the first interposer part 470, the second interposer part 480, and the metal structure 520 of the circuit board module 400b of FIGS. 11 and 12.

In FIGS. 13, 14 and 15, "Z" may refer to the thickness direction of the circuit board module 400c, 400d, or 400e. In addition, in an embodiment of the disclosure, "+Z" may refer to a forward direction (e.g., a first direction) in which the circuit board module 400c, 400d, or 400e faces a display (e.g., the display 330 in FIG. 4), and "−Z" may refer to a rearward direction (e.g., a second direction) in which the circuit board module 400c, 400d, or 400e faces a rear plate (e.g., the rear plate 380 in FIG. 4).

According to various embodiments, the circuit board module 400c, 400d, or 400e may include a first circuit board 410 having a top surface (a surface oriented in the first direction (+Z-axis direction)) and/or a bottom surface (a surface oriented in the second direction (−Z-axis direction)) on which components are disposed, a (2-1)$^{th}$ circuit board 420 disposed to be spaced apart from a (1-1)$^{th}$ region S1 of the first circuit board 410 by a first distance d1, and a (2-2)$^{th}$ circuit board 430 disposed to be spaced apart from a (1-2)$^{th}$ region S2 of the first circuit board 410 by a second distance d2. The first distance d1 and the second distance d2 may be different from each other.

According to various embodiments, the circuit board module 400c, 400d, or 400e may further include a third circuit board 440, and the third circuit board 440 may include a $(3-1)^{th}$ region S3 corresponding to the $(1-1)^{th}$ region S1 and a $(3-2)^{th}$ region S4 corresponding to the $(1-2)^{th}$ region S2. According to an embodiment, the third circuit board 440 may be manufactured to have an area substantially corresponding to that of the first circuit board 410, and may be disposed parallel with the first circuit board 410. According to an embodiment, the third circuit board 440 may be manufactured to have an area substantially smaller than that of the first circuit board 410, and may be located within the first circuit board 410 when viewed from above the circuit board module 400c, 400d, or 400e. An interposer unit (e.g., interposer parts) having a closed loop shape and disposed between the first circuit board 410 and the third circuit board 440 may be manufactured to have an area smaller than the area of the first circuit board 410 and/or the area of the third circuit board 440, and may be located inside the first circuit board 410 and/or the third circuit board 440.

According to various embodiments, components may be disposed on the top surface and/or the bottom surface of the third circuit board 440, the $(2-1)^{th}$ circuit board 420 may be disposed to be spaced apart from the $(3-1)^{th}$ region S3 of the third circuit board 440 by a third distance d3, and the $(2-2)^{th}$ circuit board 430 may be disposed to be spaced apart from $(3-2)^{th}$ region S4 of the third circuit board 440 by a fourth distance d4. When the $(2-1)^{th}$ circuit board 420 and the $(2-2)^{th}$ circuit board 430 have the same thickness, the sum of the first distance d1 and the third distance d3 may be the same as the sum of the second distance d2 and the fourth distances d4.

According to various embodiments, the interposer unit may include a first interposer unit disposed on one surface of the first circuit board 410 and a second interposer unit disposed on one surface of the third circuit board 440. The first interposer unit may include a plurality of parts (a first interposer part 470 and a second interposer part 480), and may be manufactured generally in a closed loop shape. The configurations of the first interposer part 470 and the second interposer part 480 of FIGS. 5 to 12 are applicable to those of the first interposer part 470 and the second interposer part 480.

According to various embodiments, the second interposer unit may include a plurality of parts (a third interposer part 530 and a fourth interposer part 540), and may be manufactured generally in a closed loop shape. The third interposer part 530 may be disposed between a $(3-1)^{th}$ region S3 of the third circuit board 440 and a $(2-1)^{th}$ circuit board 420. The fourth interposer part 540 may be disposed between a $(3-2)^{th}$ region S4 of the third circuit board 440 and a $(2-2)^{th}$ circuit board 430.

According to an embodiment, the third interposer part 530 may be disposed to face the first interposer part 470 with the $(2-1)^{th}$ circuit board 420 interposed therebetween. The third interposer part 530 may have a quadrilateral loop shape in which a portion facing the $(2-2)^{nd}$ circuit board 430 is opened. For example, the third interposer part 530 may be provided in a "⊏" shape. The third interposer part 530 may be disposed along an edge region of the $(3-1)^{th}$ region S3 of the third circuit board 440 and/or an edge region of the $(2-1)^{th}$ circuit board 420, and the top surface thereof may be soldered to the bottom surface of the $(3-1)^{th}$ region S3. The bottom surface of the third interposer part 530 may be soldered to the top surface of the $(2-1)^{th}$ circuit board 420.

According to an embodiment, the fourth interposer part 540 may be disposed to face the second interposer part 480 with the $(2-2)^{th}$ circuit board 430 interposed therebetween. The fourth interposer part 540 may have a quadrilateral loop shape in which a portion facing the $(2-1)^{th}$ circuit board 420 is opened. For example, the fourth interposer part 540 may be provided in a "⊐" shape. The fourth interposer part 540 may be disposed along an edge region of the $(3-2)^{th}$ region S4 of the third circuit board 440 and/or an edge region of the $(2-2)^{th}$ circuit board 430, and the top surface thereof may be soldered to the bottom surface of the $(3-2)^{th}$ region S4. The bottom surface of the fourth interposer part 540 may be soldered to the top surface of the $(2-2)^{th}$ circuit board 430.

According to an embodiment, the third interposer part 530 and the fourth interposer part 540 may have different thicknesses (e.g., heights). The first circuit board 410 and the third circuit board 440 are arranged parallel with each other, and the sum of the thicknesses (e.g., the heights) of the first interposer part 470, the (2-1)th circuit board 420, and the third interposer part 470 disposed between the first circuit board 410 and the third circuit board 440 may be the same as the sum of the thicknesses (e.g., the heights) of the second interposer part 480, the $(2-2)^{th}$ circuit board 430, and the fourth interposer part 540.

According to various embodiments, in the circuit board module 400c, 400d, or 400e, since circuit boards are disposed in a stacked manner, a large number of components can be mounted on the circuit board module 400c, 400d, or 400e. According to the disclosure, it is possible to increase the number of surfaces on which components can be mounted to six or more. For example, a plurality of components can be disposed in a shieldable region of an internal space of the circuit board module 400c, 400d, or 400e. The first component 451 and/or the second component 452 may be mounted on the top surface (the surface oriented in the first direction (+Z-axis direction)) of the first circuit board 410, and the third component 453 may be mounted on the top surface or the bottom surface of the $(2-1)^{th}$ circuit board 420. The fourth component 454 may be mounted on the top surface or the bottom surface of the $(2-2)^{th}$ circuit board 430, and the fifth component 454 may be mounted on the bottom surface (the surface oriented in the second direction (−Z-axis direction)) of the third circuit board 440. As another example, a plurality of components may be disposed on the outer surface of the circuit board module 400c, 400d, or 400e. The sixth component 456 may be mounted on the bottom surface of the first circuit board 410, or the seventh component 457 may be mounted on the top surface of the third circuit board 440.

An electronic device (e.g., the electronic device 101 of FIGS. 1 to 4) according to various example embodiments may include: a display (e.g., the display 330 in FIG. 4), a first circuit board (e.g., the first circuit board 410 in FIG. 5) disposed under the display, a first component (e.g., the first component 451 in FIG. 5) and a second component (e.g., the second component 452 in FIG. 5) disposed on one surface of the first circuit board, the first and second components each having different heights, a first interposer (e.g., the first interposer part 470 in FIG. 5) surrounding at least one side surface of the first component and disposed in a first region of the first circuit board, the first interposer part having a first height, a second interposer part (e.g., the second interposer part 480 in FIG. 5) surrounding at least one side surface of the second component and disposed in a second region of the first circuit board, the second interposer having a second height different from the first height, a first second circuit board (e.g., the $(2-1)^{th}$ circuit board 420 in FIG. 5), at least a portion of which is disposed to be spaced apart from the first region of the first circuit board, the first second circuit board including a first first portion (e.g., the $(1-1)^{th}$ portion 421 in FIG. 5) bonded to the first interposer part, and a second second circuit board (e.g., the $(2-2)^{th}$ circuit board 430 in FIG. 5), at least a portion of which is disposed to be spaced apart from the second region of the first circuit board, the second second circuit board including a first second portion (e.g., the $(2-1)^{th}$ portion 431 in FIG. 5) bonded to the second interposer part and being spaced apart from the first second circuit board by a specified gap.

According to various example embodiments, the first second circuit board and the second second circuit board may be spaced apart from each other in a horizontal direction or a vertical direction.

According to various example embodiments, a second first portion (e.g., the $(1-2)^{th}$ portion 422 in FIG. 7) different from the first first portion of the first second circuit board and a second second portion (e.g., the $(2-2)^{th}$ portion 432 in FIG. 7) different from the first second portion of the second second circuit board may be disposed to overlap each other when viewed from above the first second circuit board and/or the second second circuit board.

According to various example embodiments, for electrical connection between the first second circuit board and the second second circuit board, the second first portion of the first second circuit board and the second second portion of the second second circuit board may be soldered to each other.

According to various example embodiments, solder (e.g., the solder 510 in FIG. 9A) and the second second portion of the second second circuit board may be disposed to be stacked above the second first portion of the first second circuit board when viewed from a side surface of the first second circuit board and/or the second second circuit board.

According to various example embodiments, the gap between the first second circuit board and the second second circuit board may be shielded through the soldering.

According to various example embodiments, a third portion (e.g., the first portion 420a in FIG. 11) of the first second circuit board adjacent to the second second circuit board and a fourth portion (e.g., the third portion 430a in FIG. 11) of the second second circuit board adjacent to the first second circuit board may be disposed to be spaced apart from each other when viewed from above the first second circuit board and/or the second second circuit board, and the third portion of the first second circuit board and the fourth portion of the second second circuit board may be electrically connected to each other by a metal structure (e.g., the metal structure 520 in FIG. 11).

According to various example embodiments, the metal structure may include a first bridge (e.g., the first bridge 521 in FIG. 11) coupled to a top surface of the first second circuit board, a second bridge (e.g., the second bridge 522 of FIG. 11) coupled to a top surface of the second second circuit board, and a connection portion (e.g., the connection portion 523 of FIG. 11) connecting the first bridge and the second bridge, and a length of the first bridge and a length of the second bridge may be different from each other.

According to various example embodiments, the metal structure may be disposed along the third portion (e.g., the first portion 420a in FIG. 11) of the first second circuit board and the fourth portion (e.g., the third portion 430a in FIG. 11) of the second second circuit board and may shield the gap between the first second circuit board and the second second circuit board.

According to various example embodiments, the first interposer part may be disposed along an edge of the first region between the first circuit board and the first second circuit board, and the second interposer part may be disposed along an edge of the second region between the first circuit board and the second second circuit board.

According to various example embodiments, the first interposer may include a line portion including a linear shape and opposite end portions configured to be connected to the second interposer part or another interposer part, and at least one of the opposite end portions may include a stepped shape.

According to various example embodiments, the first interposer may be configured to surround at least two side surfaces of the first component, and may have a shape in which a region facing the second component is open, and the second interposer may be configured to surround at least two side surfaces of the second component, and may have a shape in which a region facing the first component is open.

According to various example embodiments, a first end portion (e.g., the first end portion R1 in FIG. 8) of the first interposer part and a second end portion (e.g., the second end portion R2 in FIG. 8) connected to the first end portion may be disposed to at least partially overlap each other when viewed from a side surface of the first interposer part and/or the second interposer part.

According to various example embodiments, the electronic device may further include a third circuit board (e.g., the third circuit board 440 in FIG. 13) disposed parallel with the first circuit board and including a third region (e.g., the $(3-1)^{th}$ region S3) corresponding to the first region (e.g., the $(1-1)^{th}$ region S1 in FIG. 13) and a fourth region (e.g., the $(3-2)^{th}$ region S4 in FIG. 13) corresponding to the second region (e.g., the $(1-2)^{th}$ region S2 in FIG. 13), a third interposer part (e.g., the third interposer part 530 in FIG. 13) disposed between the third region of the third circuit board and the first second circuit board, and having a third height, and a fourth interposer (e.g., the fourth interposer part 540 in FIG. 13) disposed between the fourth region of the third circuit board and the second second circuit board, and having a fourth height different from the third height.

According to various example embodiments, the first circuit board may include a top surface and a bottom surface on which the first component and/or the second component are disposed, the first second circuit board may include a top surface and a bottom surface on which the third component is mounted, the second second circuit board may include a top surface and a bottom surface on which the fourth component is mounted, and the third circuit board may include a top surface and a bottom surface on which a fifth component is mounted.

According to various example embodiments, the first component and/or the second component may be disposed over the first region and the second region of the first circuit board.

An electronic device (e.g., the electronic device 101 in FIGS. 1 to 4) according to various embodiments may include: a display (e.g., the display 330 in FIG. 4), a first circuit board (e.g., the first circuit board 410 in FIG. 5) disposed under the display, a first component (e.g., the first component 451 in FIG. 5) and a second component (e.g., the second component 452 in FIG. 5) disposed on one surface of the first circuit board, the first component and the second component each having different heights, a first second circuit board (e.g., the (2-1)$^{th}$ circuit board 420 in FIG. 5), at least a portion of which is disposed parallel with a first region of the first circuit board, a second second circuit board (e.g., the (2-2)$^{th}$ circuit board 430 in FIG. 5), at least a portion of which is disposed parallel with a second region of the first circuit board, a first interposer (e.g., the first interposer part 470 in FIG. 5) disposed between the first region of the first circuit board and the first second circuit board, the first interposer surrounding at least two side surfaces of the first component and having a first height, and a second interposer part (e.g., the second interposer part 480 in FIG. 5) disposed between the second region of the first circuit board and the second second circuit board, the second interposer part surrounding at least two side surfaces of the second component and having a second height different from the first height, wherein a first portion of the first second circuit board facing the second second circuit board may overlap at least a portion of a second portion of the second second circuit board facing the first second circuit board.

According to various example embodiments, for electrical connection between the first second circuit board and the second second circuit board, the first portion of the first second circuit board and the second portion of the second second circuit board may be soldered to each other.

An electronic device (e.g., the electronic device 101 in FIGS. 1 to 4) according to various embodiments may include: a display (e.g., the display 330 in FIG. 4), a first circuit board (e.g., the first circuit board 410 in FIG. 13) disposed under the display, a second circuit board (e.g., the third circuit board 440 in FIG. 13) disposed parallel with the first circuit board between the display and the first circuit board, a first component (e.g., the first component 451 in FIG. 13) disposed in a first region of the first circuit board, a second component (e.g., the second component 452 in FIG. 13) at least a portion of which is disposed in a second region adjacent to the first region of the first circuit board, a first third circuit board (e.g., the (2-1)$^{th}$ circuit board 420 in FIG. 13) disposed between the first region of the first circuit board and the second circuit board and spaced apart from the first region by a first distance, a second third circuit board (e.g., the (2-2)$^{th}$ circuit board 430 in FIG. 13) disposed between the second region of the first circuit board and the second circuit board and spaced apart from the second region by a second distance different from the first distance, a first interposer part (e.g., the first interposer part 470 in FIG. 13) surrounding at least one side surface of the first component and coupled between the first region of the first circuit board and the first third circuit board, a second interposer part (e.g., the second interposer part 480 in FIG. 13) surrounding at least one side surface of the second component and coupled between the second region of the first circuit board and the second third circuit board, a third interposer part (e.g., the third interposer part 530 in FIG. 13) coupled between the first third circuit board and a third region of the second circuit board, and a fourth interposer part (e.g., the fourth interposer part 540 in FIG. 13) coupled between the second third circuit board and a fourth region of the second circuit board.

According to various example embodiments, the first third circuit board and the second third circuit board may be spaced apart from each other in a horizontal direction or a vertical direction.

As will be apparent to a person ordinarily skilled in the technical field to which the disclosure belongs, a circuit board module according to various example embodiments of the disclosure and an electronic device including the same are not limited by the above-described embodiments and drawings, and may be variously substituted, modified, and changed within the technical scope of the disclosure.

What is claimed is:

1. An electronic device comprising:
a display;
a first circuit board disposed under the display;
a first component and a second component disposed on one surface of the first circuit board, the first and second components each having different heights;
a first interposer part surrounding at least one side surface of the first component and disposed in a first region of the first circuit board, the first interposer part having a first height;
a second interposer part surrounding at least one side surface of the second component and disposed in a second region of the first circuit board, the second interposer part having a second height different from the first height;
a first second circuit board, at least a portion of which is disposed to be spaced apart from the first region of the first circuit board, the first second circuit board including a first first portion bonded to the first interposer part; and
a second second circuit board, at least a portion of which is spaced apart from the second region of the first circuit board, the second second circuit board including a first second portion bonded to the second interposer part spaced apart from the first second circuit board by a specified gap,
wherein a second first portion different from the first first portion of the first second circuit board and a second second portion different from the first second portion of the second second circuit board are disposed to overlap each other when viewed from above the first second circuit board and/or the second second circuit board.

2. The electronic device of claim 1, wherein the first second circuit board and the second second circuit board are spaced apart from each other in a horizontal direction or a vertical direction.

3. The electronic device of claim 1, wherein the second first portion of the first second circuit board and the second second portion of the second second circuit board are coupled to each other for electrical connection between first second circuit board and second second circuit board.

4. The electronic device of claim 1, wherein the second first portion of the first second circuit board and the second second portion of the second second circuit board are soldered to each other.

5. The electronic device of claim 4, wherein solder and the second second portion of the second second circuit board are disposed to be stacked above the second first portion of the first second circuit board when viewed from a side surface of the first second circuit board and/or the second second circuit board.

6. The electronic device of claim 4, wherein the gap between the first second circuit board and the second second circuit board is shielded through the soldering.

7. The electronic device of claim 2, wherein a third portion of the first second circuit board adjacent to the second second circuit board and a fourth portion of the second second circuit board adjacent to the first second circuit board are disposed to be spaced apart from each other when viewed from above the first second circuit board and/or the second second circuit board, and the third portion of the first second circuit board and the fourth portion of the second second circuit board are electrically connected to each other by a metal structure.

8. The electronic device of claim 7, wherein the metal structure includes a first bridge coupled to a top surface of the first second circuit board, a second bridge coupled to a top surface of the second second circuit board, and a connection portion connecting the first bridge and the second bridge, and a length of the first bridge and a length of the second bridge being different from each other.

9. The electronic device of claim 8, wherein the metal structure is disposed along the third portion of the first second circuit board and the fourth portion of the second second circuit board and shields the gap between the first second circuit board and the second second circuit board.

10. The electronic device of claim 2, wherein the first interposer part is disposed along an edge of the first region between the first circuit board and the first second circuit board, and the second interposer part is disposed along an edge of the second region between the first circuit board and the second second circuit board.

11. An electronic device comprising:

a display;

a first circuit board disposed under the display;

a first component and a second component disposed on one surface of the first circuit board, the first and second components each having different heights;

a first interposer part surrounding at least one side surface of the first component and disposed in a first region of the first circuit board, the first interposer part having a first height;

a second interposer part surrounding at least one side surface of the second component and disposed in a second region of the first circuit board, the second interposer part having a second height different from the first height;

a first second circuit board, at least a portion of which is disposed to be spaced apart from the first region of the first circuit board, the first second circuit board including a first first portion bonded to the first interposer part; and a second second circuit board, at least a portion of which is spaced apart from the second region of the first circuit board, the second second circuit board including a first second portion bonded to the second interposer part spaced apart from the first second circuit board by a specified gap, wherein the first interposer part is disposed along an edge of the first region between the first circuit board and the first second circuit board, the second interposer part is disposed along an edge of the second region between the first circuit board and the second second circuit board, the first interposer part includes a line portion having a linear shape and opposite end portions configured to be connected to the second interposer part or another interposer part, and at least one of the opposite end portions has a stepped shape.

12. The electronic device of claim 10, wherein the first interposer part surrounds at least two side surfaces of the first component, and has a shape in which a region facing the second component is open, and the second interposer part surrounds at least two side surfaces of the second component, and has a shape in which a region facing the first component is open.

13. The electronic device of claim 10, wherein a first end portion of the first interposer part and a second end portion of the second interposer part connected to the first end portion at least partially overlap each other when viewed from a side surface of the first interposer part and/or the second interposer part.

14. An electronic device comprising:

a display;

a first circuit board disposed under the display;

a first component and a second component disposed on one surface of the first circuit board, the first and second components each having different heights;

a first interposer part surrounding at least one side surface of the first component and disposed in a first region of the first circuit board, the first interposer part having a first height;

a second interposer part surrounding at least one side surface of the second component and disposed in a second region of the first circuit board, the second interposer part having a second height different from the first height;

a first second circuit board, at least a portion of which is disposed to be spaced apart from the first region of the first circuit board, the first second circuit board including a first first portion bonded to the first interposer part;

a second second circuit board, at least a portion of which is spaced apart from the second region of the first circuit board, the second second circuit board including a first second portion bonded to the second interposer part spaced apart from the first second circuit board by a specified gap, wherein the first second circuit board and the second second circuit board are spaced apart from each other in a horizontal direction or a vertical direction;

a third circuit board disposed parallel with the first circuit board and including a third region corresponding to the first region and a fourth region corresponding to the second region;

a third interposer part disposed between the third region of the third circuit board and the first second circuit board, and having a third height; and a fourth interposer part disposed between the fourth region of the third circuit board and the second second circuit board, and having a fourth height different from the third height.

15. The electronic device of claim 14, wherein the first circuit board includes a top surface and a bottom surface on which the first component and/or the second component are disposed, the first second circuit board includes a top surface and a bottom surface on which a third component is mounted, the second second circuit board includes a top surface and a bottom surface on which a fourth component is mounted, and the third circuit board includes a top surface and a bottom surface on which a fifth component is mounted.

16. The electronic device of claim 11, wherein a second first portion different from the first first portion of the first second circuit board and a second second portion different from the first second portion of the second second circuit board are disposed to overlap each other when viewed from above the first second circuit board and/or the second second circuit board, and the second first portion of the first second circuit board and the second second portion of the second second circuit board are soldered to each other.

17. The electronic device of claim 11, wherein the first second circuit board and the second second circuit board are spaced apart from each other in a horizontal direction or a vertical direction, a third portion of the first second circuit board adjacent to the second second circuit board and a fourth portion of the second second circuit board adjacent to the first second circuit board are disposed to be spaced apart from each other when viewed from above the first second circuit board and/or the second second circuit board, and the third portion of the first second circuit board and the fourth portion of the second second circuit board are electrically connected to each other by a metal structure.

18. The electronic device of claim 14, wherein a second first portion different from the first first portion of the first second circuit board and a second second portion different from the first second portion of the second second circuit board are disposed to overlap each other when viewed from above the first second circuit board and/or the second second circuit board, and the second first portion of the first second circuit board and the second second portion of the second second circuit board are soldered to each other.

19. The electronic device of claim 14, wherein the first second circuit board and the second second circuit board are spaced apart from each other in a horizontal direction or a vertical direction, a third portion of the first second circuit board adjacent to the second second circuit board and a fourth portion of the second second circuit board adjacent to the first second circuit board are disposed to be spaced apart from each other when viewed from above the first second circuit board and/or the second second circuit board, and the third portion of the first second circuit board and the fourth portion of the second second circuit board are electrically connected to each other by a metal structure.

* * * * *